(12) United States Patent
Park et al.

(10) Patent No.: US 12,342,723 B2
(45) Date of Patent: Jun. 24, 2025

(54) ION THERMOELECTRIC ELASTOMER AND THERMOELECTRIC ELEMENT INCLUDING SAME

(71) Applicant: UIF (University Industry Foundation), Yonsei University, Seoul (KR)

(72) Inventors: Cheol Min Park, Seoul (KR); Tae Hyun Park, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 0 days.

(21) Appl. No.: 18/211,909

(22) Filed: Jun. 20, 2023

(65) Prior Publication Data
US 2024/0164213 A1    May 16, 2024

(30) Foreign Application Priority Data
Jun. 20, 2022    (KR) .................... 10-2022-0074939

(51) Int. Cl.
*H10N 10/856*    (2023.01)
*C08F 220/28*    (2006.01)
(Continued)

(52) U.S. Cl.
CPC ....... *H10N 10/856* (2023.02); *C08F 220/281* (2020.02); *C08F 222/1063* (2020.02);
(Continued)

(58) Field of Classification Search
CPC ....... H10N 10/01; H10N 10/17; H10N 10/856
See application file for complete search history.

(56) References Cited

U.S. PATENT DOCUMENTS

2022/0396672 A1* 12/2022 Bae .................. H01B 1/122

FOREIGN PATENT DOCUMENTS

| KR | 10-2087835 B1 | 3/2020 |
| KR | 10-2292189 B1 | 8/2021 |

(Continued)

OTHER PUBLICATIONS

WO 2021/080159 A1 English Translaiton as provided by FIT database, translated on Jul. 25, 2024.*

(Continued)

*Primary Examiner* — Golam Mowla
(74) *Attorney, Agent, or Firm* — Paratus Law Group, PLLC

(57) ABSTRACT

The present disclosure relates to an ion thermoelectric elastomer, which exhibit excellent thermal and air stability as well as excellent mechanical properties even under tensile stretching by adjusting poly(ethylene glycol) diacrylate (PEGDA), 2-hydroxyethyl acrylate (2-HEA), and an ion conductive dopant to a certain content range, and exhibit excellent ionic thermoelectric properties compared to conventional materials by having a high Seebeck coefficient and ionic conductivity, and a thermoelectric element including the same. Accordingly, the thermoelectric element using the ion thermoelectric elastomer according to the present disclosure as a thermoelectric material exhibits excellent mechanical performance and thermal stability, and thus exhibits excellent and stable ionic thermoelectric properties, such as excellent compatibility with a high-temperature curved surface or skin curvature, while generating an output voltage even in various environments.

4 Claims, 42 Drawing Sheets

(51) Int. Cl.
  *C08F 222/10* (2006.01)
  *C08K 5/435* (2006.01)
  *H10N 10/01* (2023.01)
  *H10N 10/17* (2023.01)
(52) U.S. Cl.
  CPC ............ *C08K 5/435* (2013.01); *H10N 10/01* (2023.02); *H10N 10/17* (2023.02); *C08F 2800/20* (2013.01); *C08F 2810/20* (2013.01)

(56) References Cited

FOREIGN PATENT DOCUMENTS

KR  10-2021-0136755 A  11/2021
WO  WO 2021/080159 A1 * 4/2021 ............. H01B 1/122

OTHER PUBLICATIONS

Korean Office Action for related KR Application No. 10-2022-0074939 mailed Aug. 20, 2023 from Korean Intellectual Property Office.
Adam F. Visentin et al., "Rapid, microwave-assisted thermal polymerization of poly(ethylene glycol) diacrylate-supported ionogels", Journal of Materials Chemistry A, Apr. 15, 2014, pp. 7723-7726, vol. 2.
Sienoh Park et al., "Mesogenic polymer composites for temperatureprogrammable thermoelectric ionogels", Journal of Materials Chemistry A, Jun. 15, 2022, pp. 13958-13968, vol. 10.

* cited by examiner

ION THERMOELECTRIC ELASTOMER AND THERMOELECTRIC ELEMENT INCLUDING SAME

CROSS-REFERENCE TO RELATED APPLICATIONS

This Application claims priority to Korean Patent Application No. 10-2022-0074939 (filed on Jun. 20, 2022), which is hereby incorporated by reference in its entirety.

BACKGROUND

The present disclosure relates to an ion thermoelectric elastomer having excellent mechanical properties and ionic thermoelectric properties, and a thermoelectric element including the same.

In recent years, with the rapid development of electronic information elements, the spread of portable information & communication devices and smart devices is being activated. Future electronic systems are expected to evolve from a simple portable type to a form that can be attached to a human body or inserted into the human body.

In particular, recently, there has been a rapid increase in interest in electrical conductors that can be bent or stretched and can be attached to a curved part such as a human skin, body, or joint part.

However, conventional wearable elements used as electrical conductors are susceptible to air and temperature exposure because of the possibility of degradation through the dehydration-evaporation of liquid components, and thus had challenges associated with poor environmental stability and reduced energy harvesting efficiency over a wide range of temperatures.

RELATED ART DOCUMENT

Patent Document (Patent Document 1) Korean Registered Patent Publication No. 10-2087835

SUMMARY OF THE INVENTION

The present disclosure is directed to providing an ion thermoelectric elastomer including a polymer matrix in which poly(ethylene glycol) diacrylate (PEGDA) and 2-hydroxyethyl acrylate (2HEA) are cross-linked and an ion conductive dopant dispersed in the polymer matrix, and a method of manufacturing the same.

The present disclosure is also directed to providing a thermoelectric element using a thermoelectric material including an ion thermoelectric elastomer.

According to one aspect of the present disclosure, an ion thermoelectric elastomer includes a polymer matrix in which poly(ethylene glycol) diacrylate (PEGDA) and 2-hydroxyethyl acrylate (2-HEA) are cross-linked, and an ion conductive dopant dispersed in the polymer matrix.

The PEGDA may have a weight average molecular weight (Mw) of 5000 g/mol to 7000 g/mol.

A content of the 2-HEA may be 40 wt % to 80 wt % based on a total of 100 wt % of the polymer matrix.

The ion conductive dopant may be included in an amount of 10 parts by weight to 100 parts by weight based on a total of 100 parts by weight of the polymer matrix.

The ion conductive dopant may include one or more selected from the group consisting of 1-Ethyl-3-methylimidazolium bis(trifluoromethylsulfonyl)imide ([EMIM][TFSI]), 1-Butyl-3-methylimidazolium bis(trifluoromethylsulfonyl)imide ([BMIM][TFSI]), 1-Ethyl-3-methylimidazolium bis(pentafluoroethanesulfonyl)imide ([EMIM][PFESI]), 1-Butyl-3-methylimidazolium bis(pentafluoroethanesulfonyl)imide ([BMIM][PFESI]), 1-Ethyl-1-methylpyrrolidinium bis(trifluoromethylsulfonyl)imide ([EMP][TFSI]), 1-Butyl-1-methylpyrrolidinium bis(trifluoromethylsulfonyl)imide ([BMP][TFSI]), trihexyl (tetradecyl) phosphonium methanesulfonate, trihexyl (tetradecyl) phosphonium dodecylbenzenesulfonate, trihexyl (tetradecyl) phosphonium chloride, and tetrabutyl phosphonium methanesulfonate.

According to another aspect of the present disclosure, a method of manufacturing an ion thermoelectric elastomer includes preparing a precursor solution including poly(ethylene glycol) diacrylate (PEGDA), 2-hydroxyethyl acrylate (2-HEA), an ion conductive dopant, and a photoinitiator, and subjecting the precursor solution to a photo-crosslinking reaction.

A content of the 2-HEA may be 40 wt % to 80 wt % based on a total weight of 100 wt % of the PEGDA and the 2-HEA combined.

The ion conductive dopant may be included in an amount of 10 parts by weight to 100 parts by weight based on a total weight of 100 parts by weight of the PEGDA and the 2-HEA.

The PEGDA may have a weight average molecular weight (Mw) of 5000 g/mol to 7000 g/mol.

The ion conductive dopant may include one or more selected from the group consisting of 1-Ethyl-3-methylimidazolium bis(trifluoromethylsulfonyl)imide ([EMIM][TFSI]), 1-Butyl-3-methylimidazolium bis(trifluoromethylsulfonyl)imide ([BMIM][TFSI]), 1-Ethyl-3-methylimidazolium bis(pentafluoroethanesulfonyl)imide ([EMIM][PFESI]), 1-Butyl-3-methylimidazolium bis(pentafluoroethanesulfonyl)imide ([BMIM][PFESI]), 1-Ethyl-1-methylpyrrolidinium bis(trifluoromethylsulfonyl)imide ([EMP][TFSI]), 1-Butyl-1-methylpyrrolidinium bis(trifluoromethylsulfonyl)imide ([BMP][TFSI]), trihexyl (tetradecyl) phosphonium methanesulfonate, trihexyl (tetradecyl) phosphonium dodecylbenzenesulfonate, trihexyl (tetradecyl) phosphonium chloride, and tetrabutyl phosphonium methanesulfonate.

The photoinitiator may be 2-Hydroxy-2-methylpropiophenone.

According to still another aspect of the present disclosure, a thermoelectric element includes a thermoelectric material including an ion thermoelectric elastomer, and a first electrode and a second electrode that are connected to one side and the other side of the thermoelectric material, respectively, and disposed on one side surfaces to face each other.

An ion thermoelectric elastomer according to the present disclosure can exhibit excellent thermal and air stability by adjusting poly(ethylene glycol) diacrylate (PEGDA), 2-hydroxyethyl acrylate (2-HEA), and an ion conductive dopant to a specific content range.

An ion thermoelectric elastomer according to the present disclosure can exhibit excellent mechanical properties even under tensile stretching by adjusting PEGDA, 2-HEA, and an ion conductive dopant to a certain content range, and can also exhibit excellent ionic thermoelectric properties compared to conventional materials by having a high Seebeck coefficient and ionic conductivity.

A thermoelectric element using the ion thermoelectric elastomer according to the present disclosure as a thermoelectric material can exhibit excellent mechanical performance and thermal stability, and thus can exhibit excellent and stable ionic thermoelectric properties, such as excellent compatibility with a high-temperature curved surface or skin curvature, while generating an output voltage even in various environments.

Figure 23:
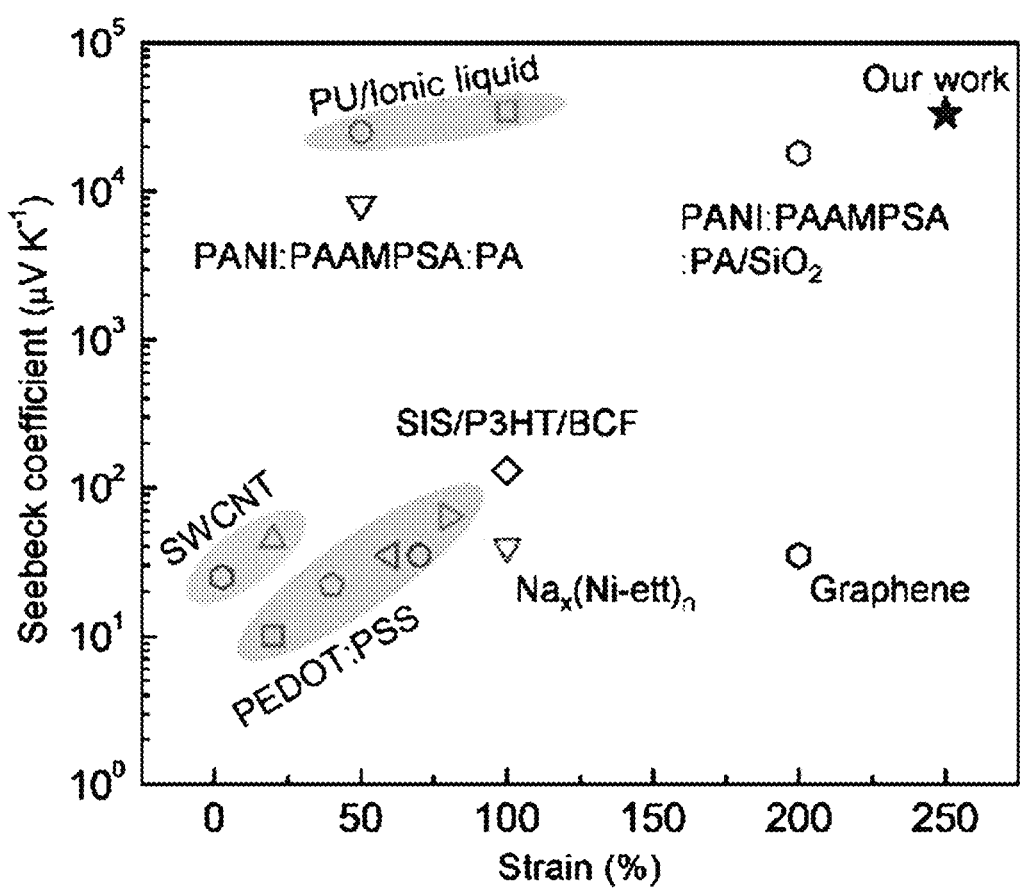

FIG. 23 is a graph illustrating a Seebeck coefficient as a function of a change in a tensile strain for the ion thermoelectric elastomer ($ITE_{0.6-30}$) prepared according to Preparation Example of the present disclosure as compared to conventional organic/inorganic hybrid materials.

Figure 24:
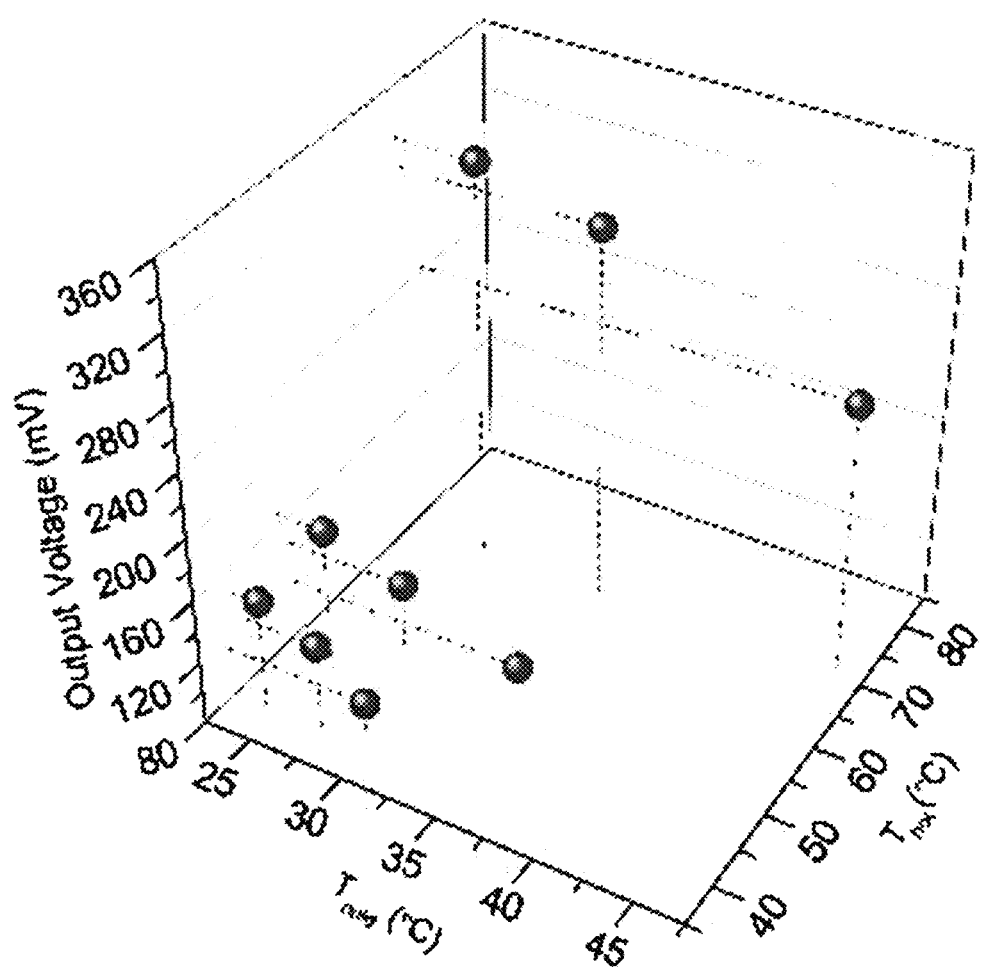

FIG. 24 is a graph illustrating an output voltage of the ion thermoelectric elastomer ($ITE_{0.6-30}$) prepared according to Preparation Example at an in-plane temperature range T (Tc, Th ° C.).

Figure 25:
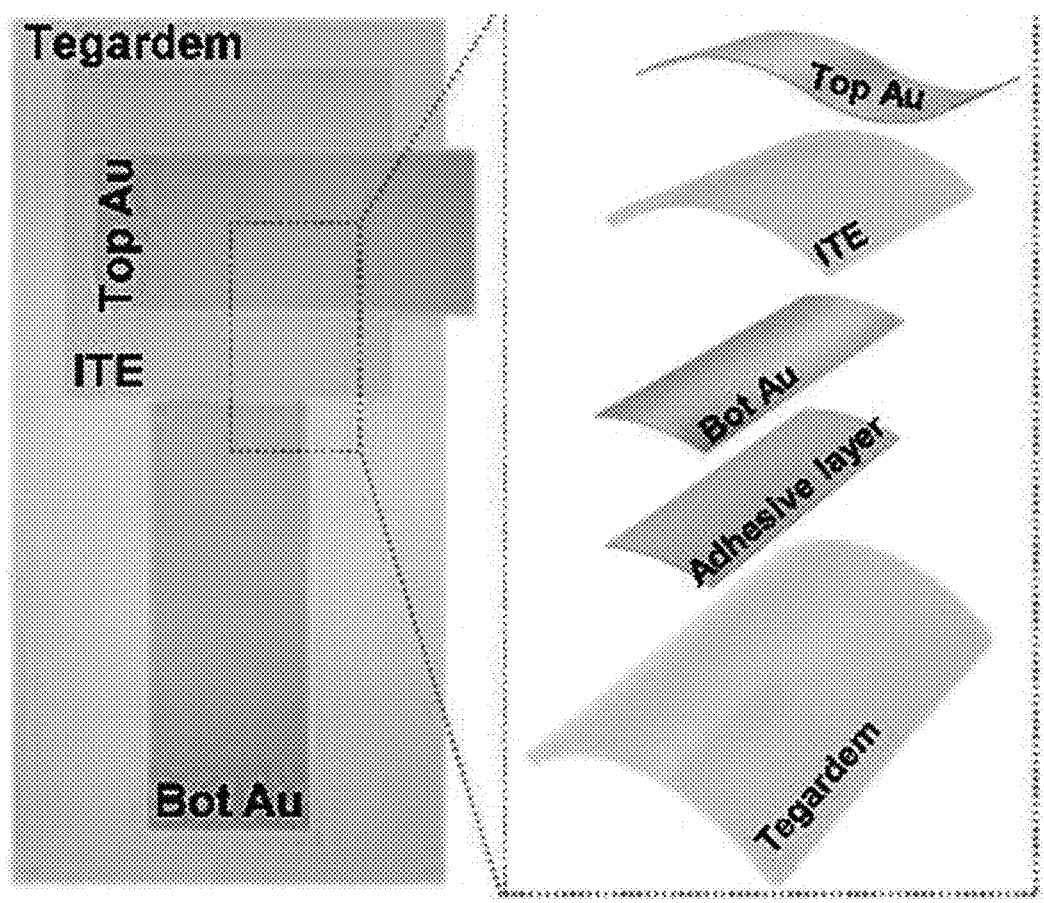

FIG. 25 is a schematic view of an ionic thermoelectric elastomer device (ITED) prepared using the ion thermoelectric elastomer prepared according to Preparation Example.

Figure 26A:
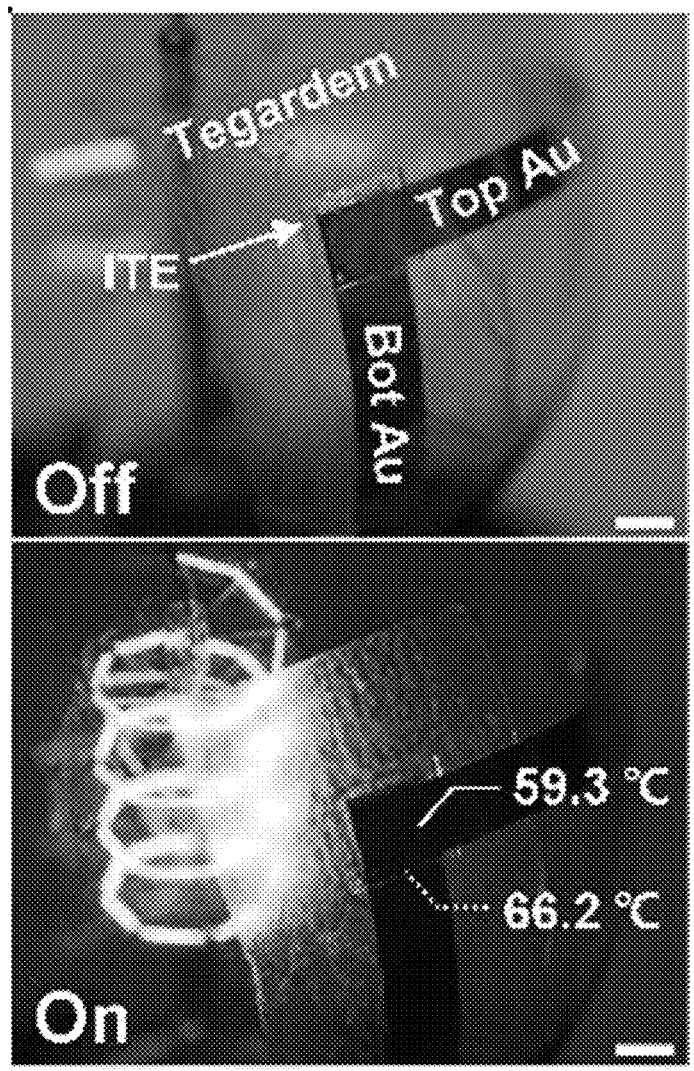
Figure 26B:
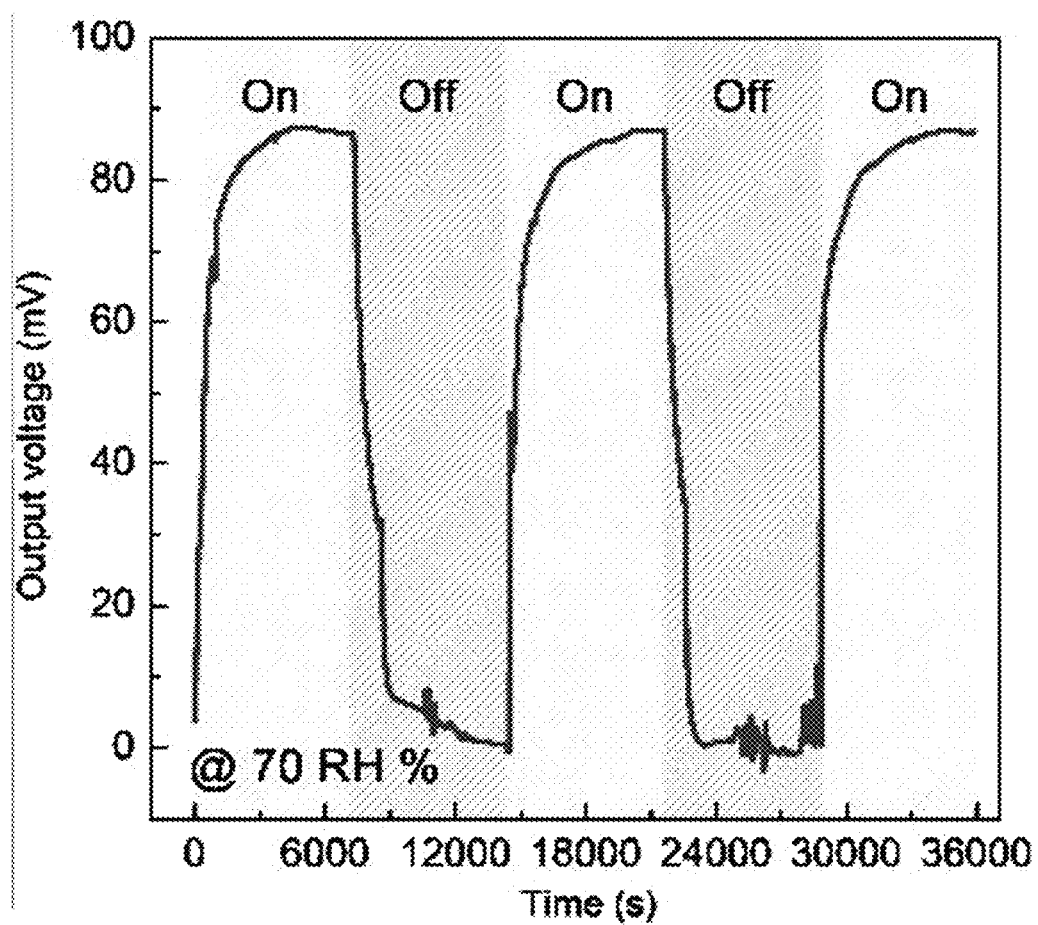

FIG. 26A is an image of the ITED positioned on a surface of a light bulb and powered up for a temperature gradient, and FIG. 26B is a graph illustrating an output voltage of the ITED after the temperature gradient of FIG. 26A.

Figure 27A:
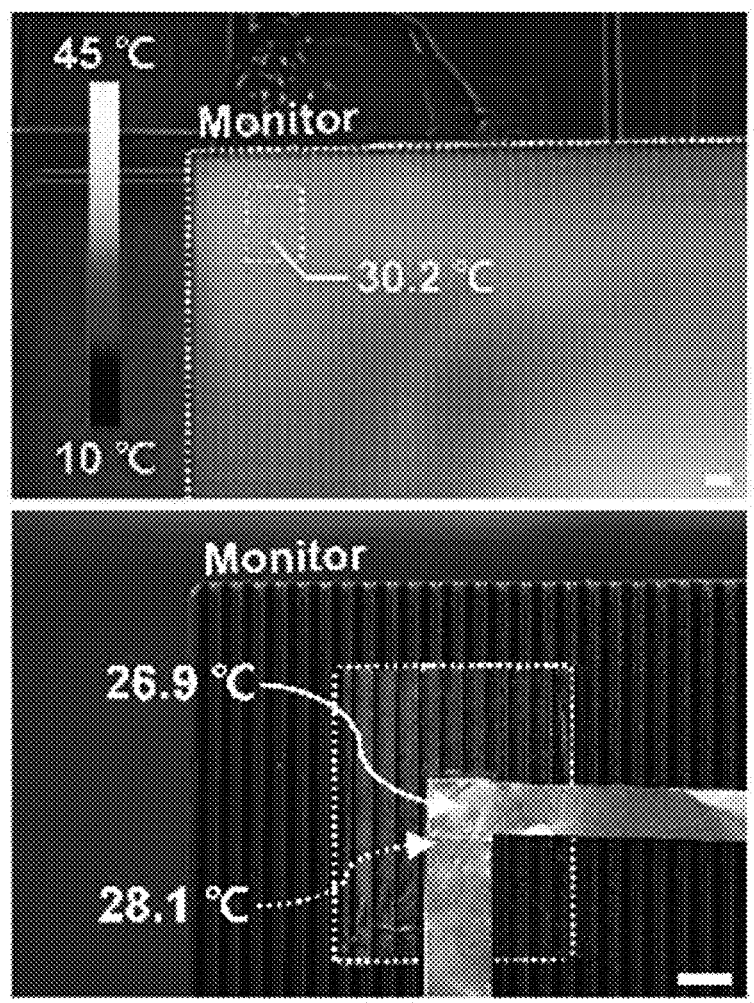
Figure 27B:
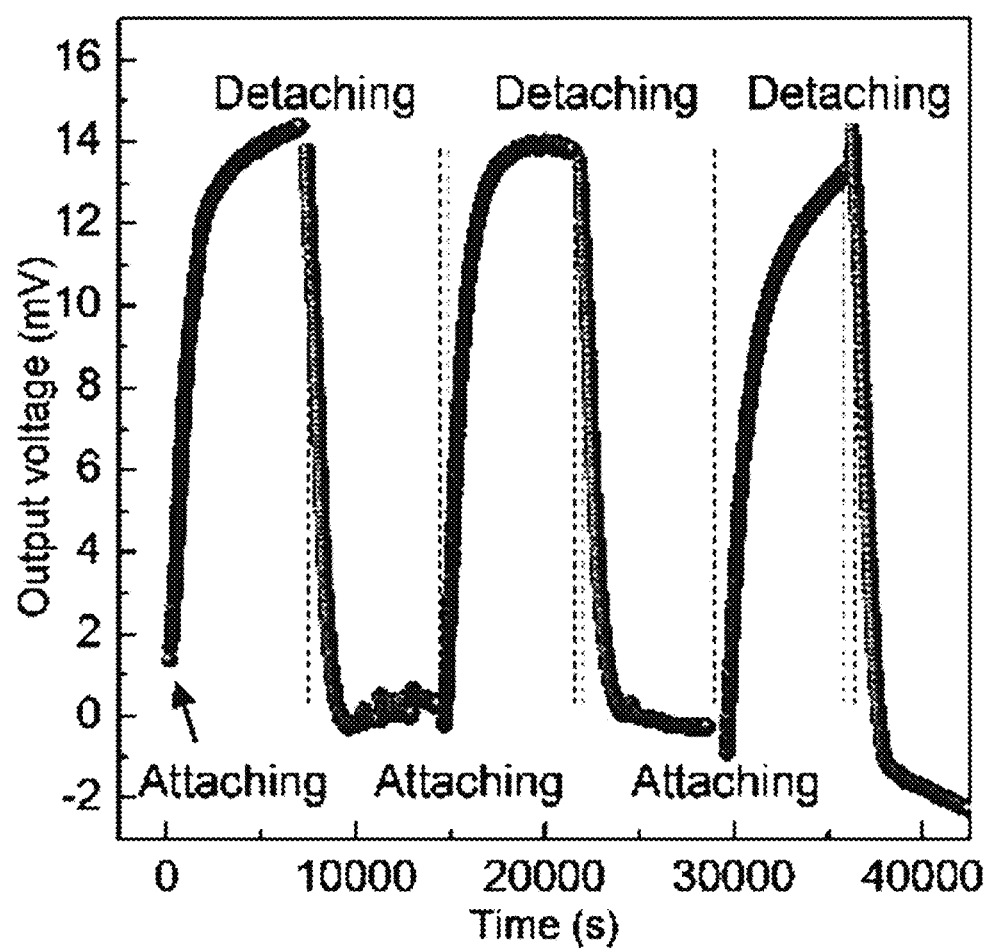

FIG. 27A is an image generated by placing the ITED on the back of a computer monitor and generating a temperature gradient, and FIG. 27B is a graph illustrating an output voltage of the ITED after the temperature gradient of FIG. 27A.

Figure 28A:
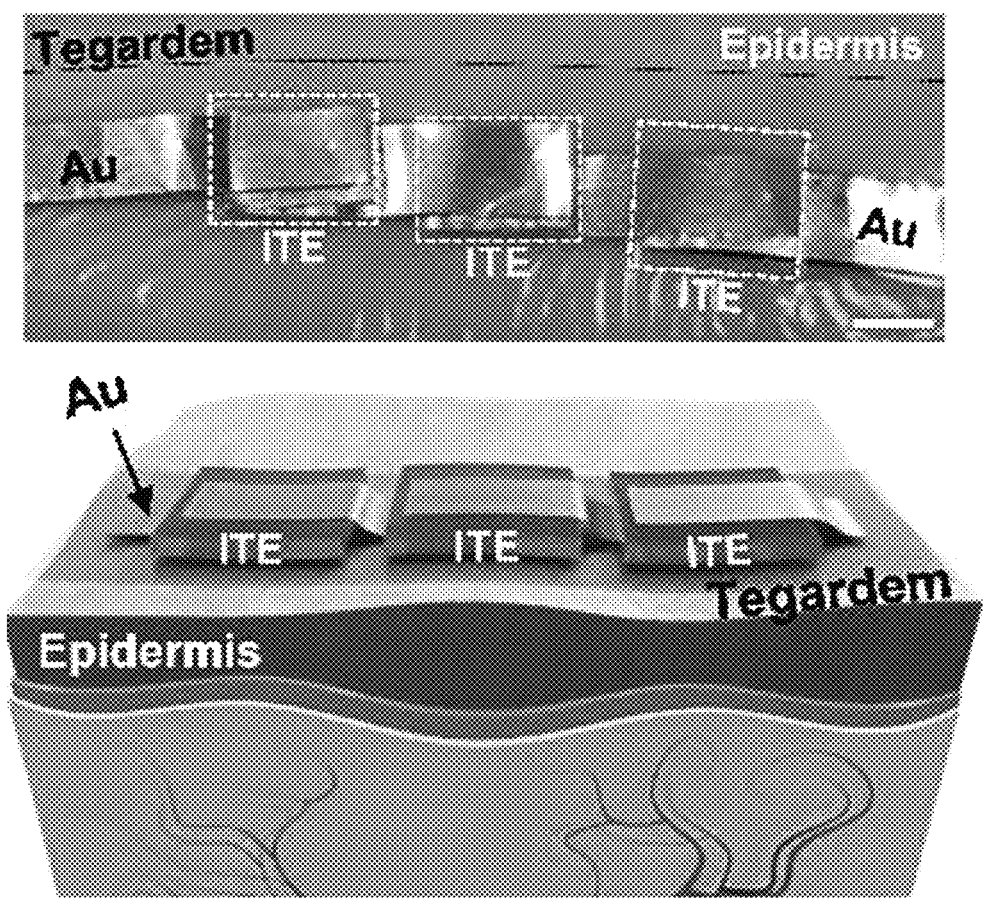
Figure 28B:
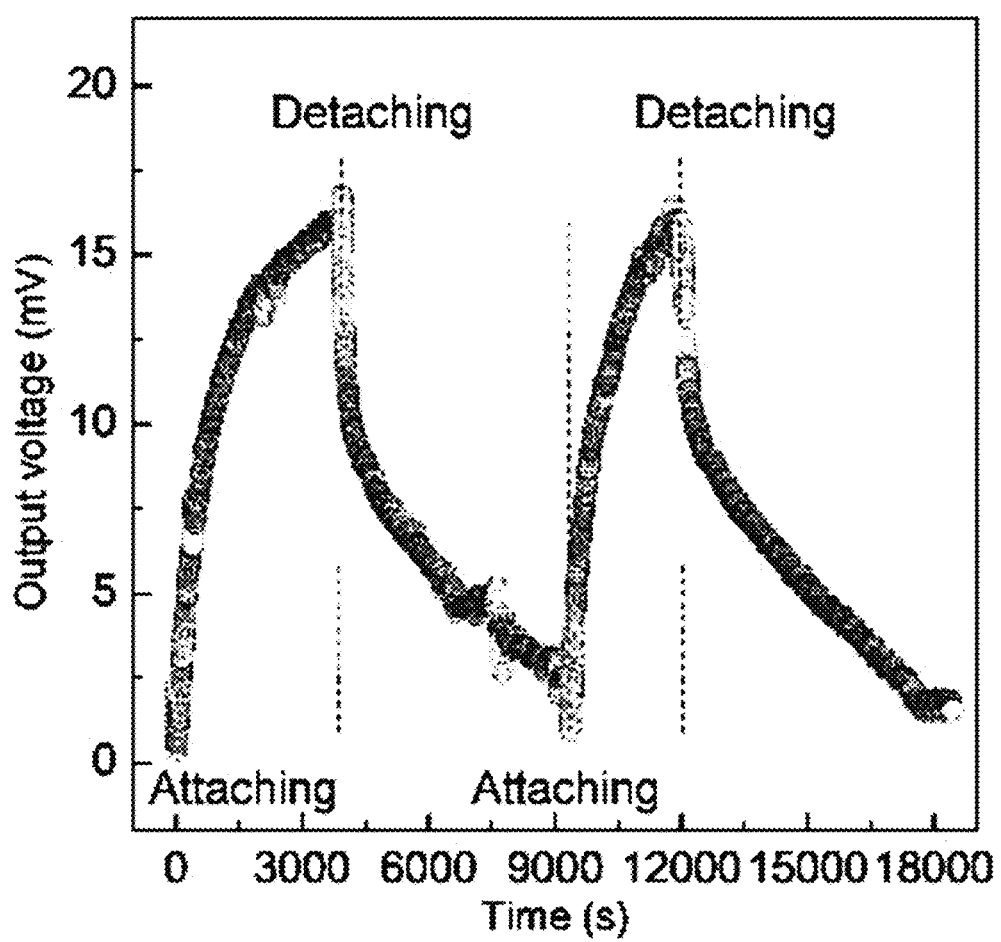

FIG. 28A is an image of the ITEDs continuously placed on a surface of a human skin, and FIG. 28B is a graph illustrating an output voltage of the ITED after the temperature gradient according to FIG. 28A.

DETAILED DESCRIPTION

The above and other objects, features, and advantages of the present disclosure will become more apparent to those of ordinary skill in the art by describing exemplary embodiments thereof to be described in detail below with reference to the accompanying drawings. However, the present disclosure is not limited to the embodiments disclosed herein, and may be modified into different forms. Rather, the embodiments introduced herein are provided so that the disclosed content is thorough and complete, and the technical spirit of the present disclosure is sufficiently conveyed to those skilled in the art.

In describing each drawing, like reference numerals are used for like elements. In the accompanying drawings, the dimensions of structures are shown larger than their actual dimensions for the purpose of clarity of the present disclosure. Terms such as first and second may be used to describe various components, but the components should not be limited by the terms. The above terms are used only for the purpose of distinguishing one component from another component. For example, without departing from the scope of the present disclosure, a first component may be referred to as a second component, and similarly, a second component may be referred to as a first component. Singular expressions include plural expressions unless the context clearly indicates otherwise.

In the present disclosure, it is to be understood that terms such as "include" or "have" are intended to designate the presence of features, numbers, steps, actions, components, parts, or combinations thereof described in the specification, but do not preclude the possibility of the presence or addition of one or more other features, numbers, steps, actions, component, parts, or combinations thereof. In addition, when a part such as a layer, a film, a region, and a plate is said to be "on" another part, this includes cases where one part is "directly on" another part, as well as cases where there is still another part therebetween. On the contrary, when a part such as a layer, a film, a region, and a plate is said to be "under" another part, this includes cases where the part is "directly under" another part, as well as cases where there is still another part therebetween.

Unless otherwise specified, all numbers, values, and/or expressions representing the amount of components, reaction conditions, polymer compositions and formulations used herein are to be understood to be modified by the term "about" in all cases, since these numbers are essentially approximations that reflect various uncertainties of measurements that occur in obtaining such values, among other things. Accordingly, it should be understood as being modified in all cases by the term "about." Further, when numerical ranges are disclosed herein, such ranges are continuous and, unless otherwise indicated, include all values from the minimum to the maximum values within the ranges. Moreover, when such ranges refer to an integer, all integers including the minimum to the maximum values are included therein, unless otherwise indicated.

In the present specification, when a range is described for a variable, it will be understood that the variable includes all values including end points described within the stated range. For example, the range of "5 to 10" will be understood to include any subranges, such as 6 to 10, 7 to 10, 6 to 9, 7 to 9, and the like, as well as individual values of 5, 6, 7, 8, 9, and 10, and will also be understood to include any value between valid integers within the stated range, such as 5.5, 6.5, 7.5, 5.5 to 8.5, 6.5 to 9, and the like. In addition, for example, the range of "10% to 30%" will be understood to include subranges, such as 10% to 15%, 12% to 18%, 20% to 30%, and the like, as well as all integers including values of 10%, 11%, 12%, 13%, and the like up to 30%, and will also be understood to include any value between valid integers within the stated range, such as 10.5%, 15.5%, 25.5%, and the like.

Conventional wearable elements used as electrical conductors are susceptible to air and temperature exposure because of the possibility of degradation through the dehydration-evaporation of liquid components, and thus had challenges associated with poor environmental stability and reduced energy harvesting efficiency over a wide range of temperatures.

Accordingly, as a result of intensive research to solve the above challenges, the present inventors have found that an ion thermoelectric elastomer containing an ion conductive dopant in a polymer matrix at a suitable content ratio exhibits excellent thermal and air stability as well as excellent mechanical properties and ionic thermoelectric properties, by manufacturing the ion thermoelectric elastomer by adjusting poly(ethylene glycol) diacrylate (PEGDA), 2-hydroxyethyl acrylate (2-HEA), and the ion conductive dopant to a certain content range, and completed the present disclosure.

According to one aspect of the present disclosure, there is provided an ion thermoelectric elastomer including a polymer matrix in which PEGDA and 2-HEA are cross-linked and an ion conductive dopant dispersed in the polymer matrix.

Figure 1:
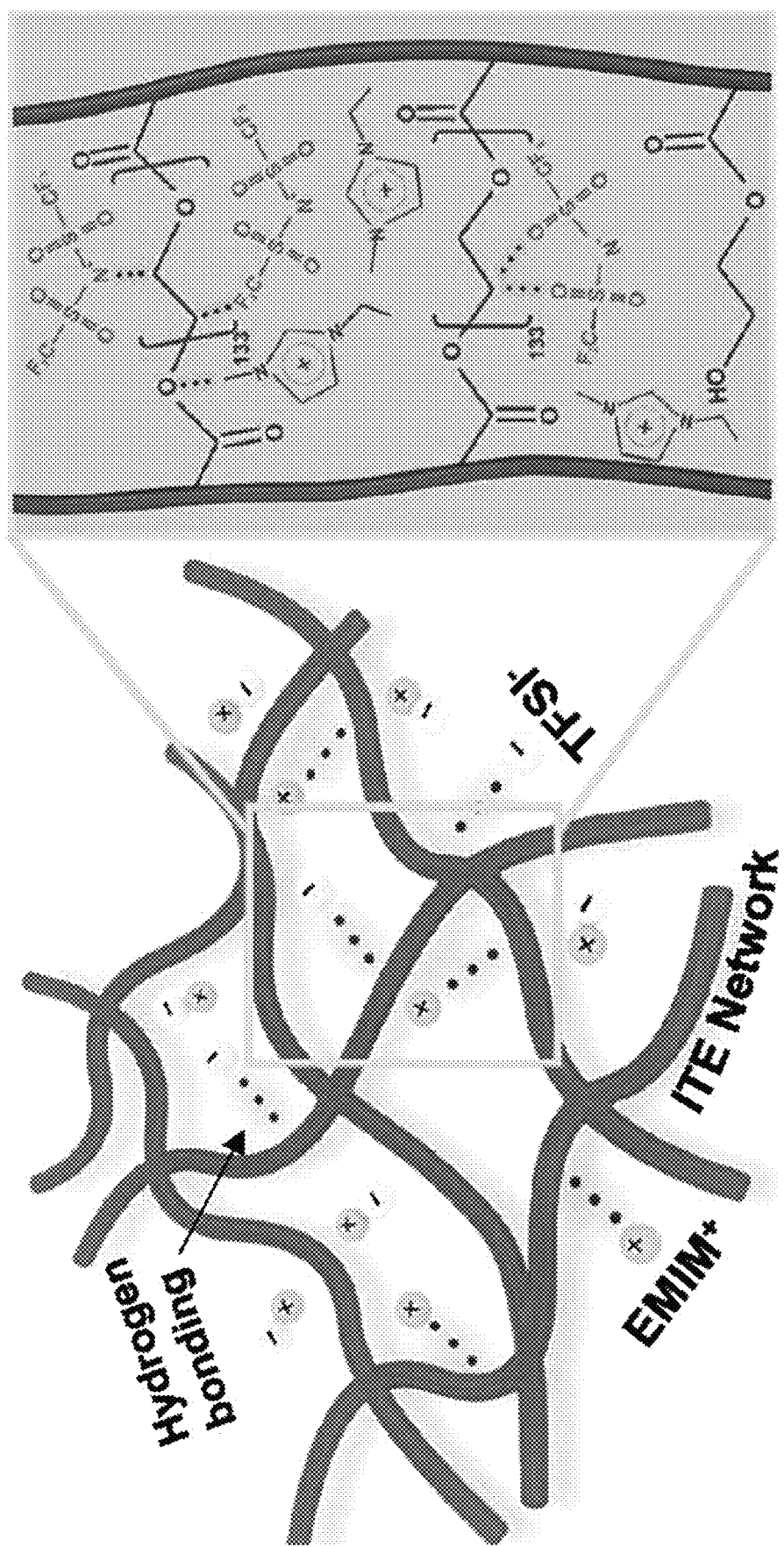
FIG. 1 is a schematic view schematically illustrating a three-dimensional network of an ion thermoelectric elastomer synthesized according to Preparation Example.

FIG. 1 is a schematic view schematically illustrating a three-dimensional network of an ion thermoelectric elastomer synthesized according to Preparation Example. Referring to this, the ion thermoelectric elastomer includes a polymer matrix in which PEGDA and 2-HEA are UV photo-crosslinked by a photoinitiator to form a three-dimensional network. In addition, an ion conductive dopant is included by hydrogen bonding with the polymer matrix.

The PEGDA according to the present disclosure can serve as an ion conductive electrolyte capable of moving ions in the polymer matrix.

According to one embodiment, the PEGDA may have a weight average molecular weight (Mw) of 5000 g/mol to 7000 g/mol, preferably 5590 g/mol to 6010 g/mol, and more preferably 6000 g/mol. When the weight average molecular weight of the PEGDA is too low outside the above range, stretchability may be reduced, and when the weight average molecular weight of the PEGDA is too high outside the above range, economic feasibility may be reduced.

The 2-HEA according to the present disclosure can contain a predetermined amount of moisture in the polymer matrix, and thus can play a role in enabling the ion thermoelectric elastomer to achieve high stability without completely drying out in the atmosphere.

According to one embodiment, a content of the 2-HEA may be 40 wt % to 80 wt % based on a total of 100 wt % of the polymer matrix. When the content of the 2-HEA is too low outside the above range, the ion thermoelectric elastomer may be easily dried, leading to reduced stability, and also, an increase in PEGDA content may cause excessive cross-linking, resulting in reduced stretchability in the ion thermoelectric elastomer. When the content of the 2-HEA is too high outside the above range, the ion thermoelectric elastomer may exhibit excellent stretchability, but may exhibit reduced thermoelectric effect and ion conduction performance due to a decrease in the PEGDA content, and may exhibit viscoelastic mechanical properties due to insufficient internal networking formation.

The ion conductive dopant according to the present disclosure is a non-hydrophilic ionic liquid, and generally has a negligible vapor pressure, resulting in excellent non-volatile properties.

In addition, the ion conductive dopant may be a non-hydrophilic ionic liquid having a thermal decomposition temperature of 300° C. or higher, and may have a very high ionic conductivity ($\tilde{}$ 1 mS/cm), a specific capacity ($\tilde{}$ 10 $\mu F/cm^2$), and a wide electrochemical stability window (4 V to 7 V) similar to those of an aqueous electrolyte.

According to one embodiment, the ion conductive dopant may include one or more selected from among 1-Ethyl-3-methylimidazolium bis(trifluoromethylsulfonyl)imide ([EMIM][TFSI]), 1-Butyl-3-methylimidazolium bis(trifluoro-methylsulfonyl)imide ([BMIM][TFSI]), 1-Ethyl-3-methylimidazolium bis(pentafluoroethanesulfonyl)imide ([EMIM][PFESI]), 1-Butyl-3-methylimidazolium bis(pentafluoroethanesulfonyl)imide ([BMIM][PFESI]), 1-Ethyl-1-methylpyrrolidinium bis(trifluoro-methylsulfonyl)imide ([EMP][TFSI]), 1-Butyl-1-methylpyrrolidinium bis(trifluoro-methylsulfonyl)imide ([BMP][TFSI]), trihexyl (tetradecyl) phosphonium methanesulfonate, trihexyl (tetradecyl) phosphonium dodecylbenzenesulfonate, trihexyl (tetradecyl) phosphonium chloride, and tetrabutyl phosphonium methanesulfonate, and may preferably include 1-Ethyl-3-methylimidazolium bis(trifluoromethylsulfonyl)imide ([EMIM][TFSI]) as long as it can be hydrogen bonded with PEGDA to form a uniform ion thermoelectric elastomer.

According to one embodiment, the ion conductive dopant may be included in an amount of 10 parts by weight to 100 parts by weight, and preferably 10 parts by weight to 50 parts by weight, based on a total of 100 parts by weight of the polymer matrix. When the content of the ion conductive dopant is too low outside the above range, the ionic conductivity and the ionic thermoelectric properties may be degraded due to insufficient amount of ions. When the content of the ion conductive dopant is too high outside the above range, the ionic thermoelectric properties may be reduced because the frequency of recombination between ions increases, which adversely affects the ionic thermoelectric properties by the Soret effect.

That is, the ion thermoelectric elastomer according to the present disclosure exhibits excellent thermal and air stability as well as excellent mechanical properties even under tensile stretching by adjusting PEGDA, 2-HEA, and an ion conductive dopant to a certain content range, and exhibits excellent ionic thermoelectric properties compared to conventional materials by having a high Seebeck coefficient and ionic conductivity.

In another aspect of the present disclosure, there is provided a method of manufacturing an ion thermoelectric elastomer, the method including preparing a precursor solution including PEGDA, 2-HEA, an ion conductive dopant, and a photoinitiator, and subjecting the precursor solution to a photo-crosslinking reaction.

Here, the same contents as those described in the ion thermoelectric elastomer according to one aspect of the present disclosure may be omitted.

The photoinitiator according to the present disclosure has the characteristic of generating radicals by ultraviolet (UV) light irradiation, and in particular, the photoinitiator may generate radicals upon irradiation with light in a UV wavelength region of 320 nm to 380 nm, preferably 330 nm to 377 nm, and more preferably 340 nm to 375 nm, and may initiate a photo-curing reaction.

According to one embodiment, the photoinitiator may include one or more selected from the group consisting of anthraquinone, anthraquinone-2-sulfonic acid sodium salt monohydrate, (benzene)tricarbonylchromium, benzil, benzoin ethyl ether, benzoin isobutyl ether, benzoin methyl ether, benzophenone, 4-benzoylbiphenyl, 4,4'-bis(diethylamino)benzophenone, 4,4'-bis(dimethylamino)benzophenone, dibenzosuberenone, 2,2-dimethoxy-2-phenylacetophenone, 3,4-dimethylbenzophenone, 3'-hydroxyacetophenone, 2-hydroxy-2-methyl propiophenone, 2-hydroxy-4'-(2-hydroxyethoxy)-2-methyl propiophenone, 1-hydroxycyclohexyphenyl ketone, methylbenzoyl formate, diphenyl(2,4,6-trimethylbenzoyl)-phosphine oxide, phosphine oxide phenyl bis(2,4,6-trimethyl benzoyl), 2-methyl-1-[4-(methylthio)phenyl]-2-(4-morpholinyl)-1-propanone, 2-benzyl-2(dimethylamino)-1-[4-(4-morpholinyl)phenyl]-1-butanone, 2-dimethylamino-2-(4-methylbenzyl)-1-(4-morpholin-4-yl-phenyl)-butan-1-one, bis(.eta.5-2,4-cyclopentadien-1-yl)-bis(2,6-difluoro-3(1h-pyrrol-1-yl)-phenyl)titanium, 2-isopropyl thioxanthone, 2-ethylanthraquinone, 2,4-diehyl thioxanthone, benzil dimethyl ketal, benzophenone, 4-chloro benzophenone, methyl-2-benzoylbenzoate, 4-phenyl benzophenone, 2,2'-bis(2-chlorophenyl)-4,4',5,5'-tetraphenyl-1,2'-bi-imidazole, 2,2',4-tris(2-chlorophenyl)-5-(3,4-dimethoxypenly)-4',5'-diphenyl-1,1'-biimidazole, 4-phenoxy-2',2'-dichloro acetophenone, ethyl-4-(dimethylamino)benzoate, isoamyl 4-(dimethylamino)benzoate, 2-ethyl hexyl-4-(dimethylamino)benzoate, 4,4'-bis(diethylamino)benzophenone, 4-(4'-methylphenylthio)-benzophenone, 1,7-bis(9-acridinyl) heptane, n-phenyl glycine, and 2-hydroxy-2-methylpropiophenone. Among these, in terms of UV light absorption, the photoinitiator may preferably include anthraquinone-2-sulfonic acid sodium salt monohydrate, benzoin ethyl ether, benzoin isobutyl ether, benzoin methyl ether, dibenzosuberenone, 2,2-dimethoxy-2-phenylacetophenone, 3,4-dimethylbenzophenone, 3'-hydroxyacetophenone, or 2-hydroxy-2-methylpropiophenone, and the photoinitiator may more preferably include 2-Hydroxy-2-methylpropiophenone.

In still another aspect of the present disclosure, there is provided a thermoelectric element including a thermoelectric material containing an ion thermoelectric elastomer, and a first electrode and a second electrode that are electrically connected to both sides of the thermoelectric material, respectively, and disposed on one side surfaces to face each other.

Here, the same contents as those described in the ion thermoelectric elastomer according to one aspect of the present disclosure may be omitted, and the ion thermoelectric elastomer may be the same as the ion thermoelectric elastomer according to one aspect of the present disclosure described above.

The first electrode and the second electrode according to the present disclosure may be formed to include a deformable inorganic material having excellent electrical conductivity. Here, the term "deformable" refers to being able to be flexibly bent or curved. The inorganic material may be formed to include at least one selected from the group consisting of nickel (Ni), aluminum (Al), copper (Cu), ruthenium (Ru), rhodium (Rh), gold (Au), tungsten (W), cobalt (Co), palladium (Pd), titanium (Ti), tantalum (Ta), iron (Fe), molybdenum (Mo), hafnium (Hf), lanthanum (La), iridium (Ir), and silver (Ag), but the present disclosure is not limited thereto.

The first electrode and the second electrode according to the present disclosure may be respectively connected to one side and the other side of the thermoelectric material. In this case, the meaning of "connected" is not limited as long as being electrically connected, and for example, the first and second electrodes and the thermoelectric material may be connected through a conductive adhesive or soldering. Accordingly, since the first electrode and the second electrode are connected to one side and the other side of the thermoelectric material, the first electrode and the second electrode may be disposed such that one side surfaces thereof faces each other.

That is, the thermoelectric element including the ion thermoelectric elastomer according to the present disclosure as a thermoelectric material exhibits excellent mechanical performance and thermal stability, and thus has the advantage of having excellent and stable ionic thermoelectric properties, such as excellent compatibility with a high-temperature curved surface or skin curvature, while generating an output voltage even in various environments.

Hereinafter, the present disclosure will be described in more detail with reference to examples. However, these examples are for illustration only, and the scope of the present disclosure is not limited to these examples.

Preparation Example: Preparation of Ion Thermoelectric Elastomer

2-Hydroxyethyl acrylate (2-HEA), poly(ethylene glycol) diacrylate (PEGDA, Mw=6,000) (PEG was purchased from Sigma-Aldrich and modified), 1-Ethyl-3-methylimidazolium bis(trifluoromethylsulfonyl)imide ([EMIM][TFSI]), which is an ion conductive dopant, and 2-hydroxy-2-methylpropiophenone (HOMPP), which is a photoinitiator, (all purchased from Sigma-Aldrich) were dissolved in ethanol in ratios according to Table 1 to prepare the precursor solution, which was then homogenized for 5 minutes through mechanical ultrasonic treatment.

TABLE 1

| Sample | 2-HEA | PEGDA | HOMPP | EtOH | EMIM+TFSI− |
|---|---|---|---|---|---|
| ITE$_{0.1\text{-}y}$ | 2 g | 3 g | 0.05 g | 5 ml | 0 g |
|  |  |  |  |  | 0.5 g |
|  |  |  |  |  | 1.5 g |
|  |  |  |  |  | 2.5 g |
|  |  |  |  |  | 5 g |
| ITE$_{0.6\text{-}y}$ | 3 g | 2 g | 0.05 g | 5 ml | 0 g |
|  |  |  |  |  | 0.5 g |
|  |  |  |  |  | 1.5 g |
|  |  |  |  |  | 2.5 g |
|  |  |  |  |  | 5 g |
| ITE$_{0.8\text{-}y}$ | 4 g | 1 g | 0.05 g | 5 ml | 0 g |
|  |  |  |  |  | 0.5 g |
|  |  |  |  |  | 1.5 g |
|  |  |  |  |  | 2.5 g |
|  |  |  |  |  | 5 g |

Here, samples are defined as "ITEx-y", where "x" represents a weight ratio of the 2-HEA to a total weight of the 2-HEA and the PEGDA, and "y" represents a weight of EMIM+TFSI− based on a total of 100 parts by weight of the 2-HEA and the PEGDA.

The above-prepared precursor solutions were then subjected to a photo-crosslinking reaction with UV light (375 nm wavelength) for 90 seconds in a hydrophobic surface-treated mold to prepare ion thermoelectric elastomers with a three-dimensional network as shown in FIG. 1.

Experimental Example 1: Examining Structure of Ion Thermoelectric Elastomer

After preparing ion thermoelectric elastomers (ITE$_{0.6\text{-}0}$ and ITE$_{0.6\text{-}100}$) according to Preparation Example, attenuated total reflectance-Fourier transform infrared (ATR-FTIR) spectroscopy was used to confirm changes in chemical bonds formed in the ion thermoelectric elastomers. Specifically, the ATR-FTIR spectroscopy was performed using a Fourier transform infrared (FT-IR) spectrometer (Vertex 70, Broker Optics Inc.) to record for the ion thermoelectric elastomers (ITE$_{0.6\text{-}0}$ and ITE$_{0.6\text{-}100}$), the PEGDA, the 2-HEA, and the EMIM+TFSI−, and the results are shown in FIGS. 2A to 2C.

Figure 2A:
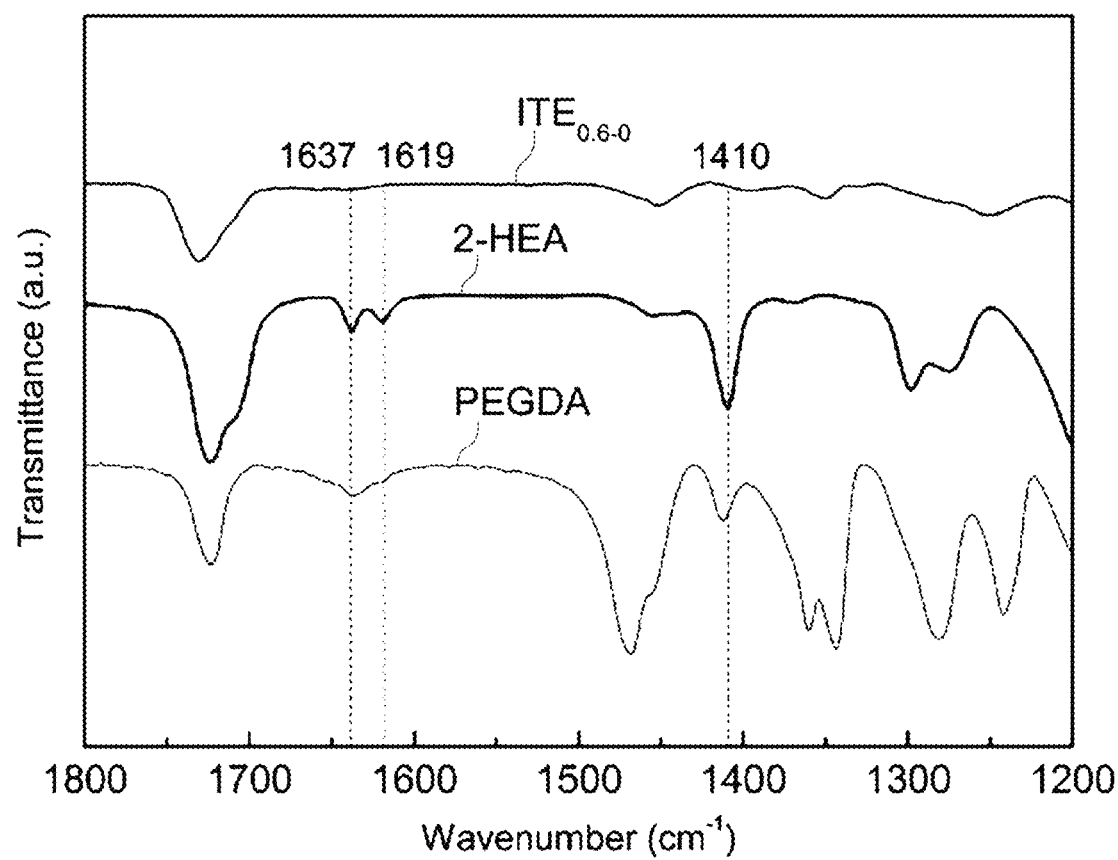
FIG. 2A is a graph illustrating attenuated total reflectance-Fourier transform infrared (ATR-FTIR) transmittance curves for 2-hydroxyethyl acrylate (2-HEA), poly(ethylene glycol) diacrylate (PEGDA), and an ion thermoelectric elastomer ($ITE_{0.6-0}$).

Specifically, FIG. 2A is a graph illustrating ATR-FTIR transmittance curves for the 2-HEA, the PEGDA, and the ion thermoelectric elastomer (ITE$_{0.6\text{-}0}$).

Referring to FIG. 2A, it was confirmed that 1637 cm$^{-1}$, 1619 cm$^{-1}$, and 1410 cm$^{-1}$, which respectively correspond to C=C symmetric stretching, C=C asymmetric stretching, and C=CH$_2$-twisted mode, were observed in the 2-HEA and the PEGDA, while the above peaks were not observed in the ion thermoelectric elastomer (ITE$_{0.6\text{-}0}$). That is, the ATR-FTIR analysis result confirmed that the synthesized ion thermoelectric elastomer (ITE$_{0.6\text{-}0}$) was synthesized by photo-crosslinking of the PEGDA and the 2-HEA.

Figure 2B:
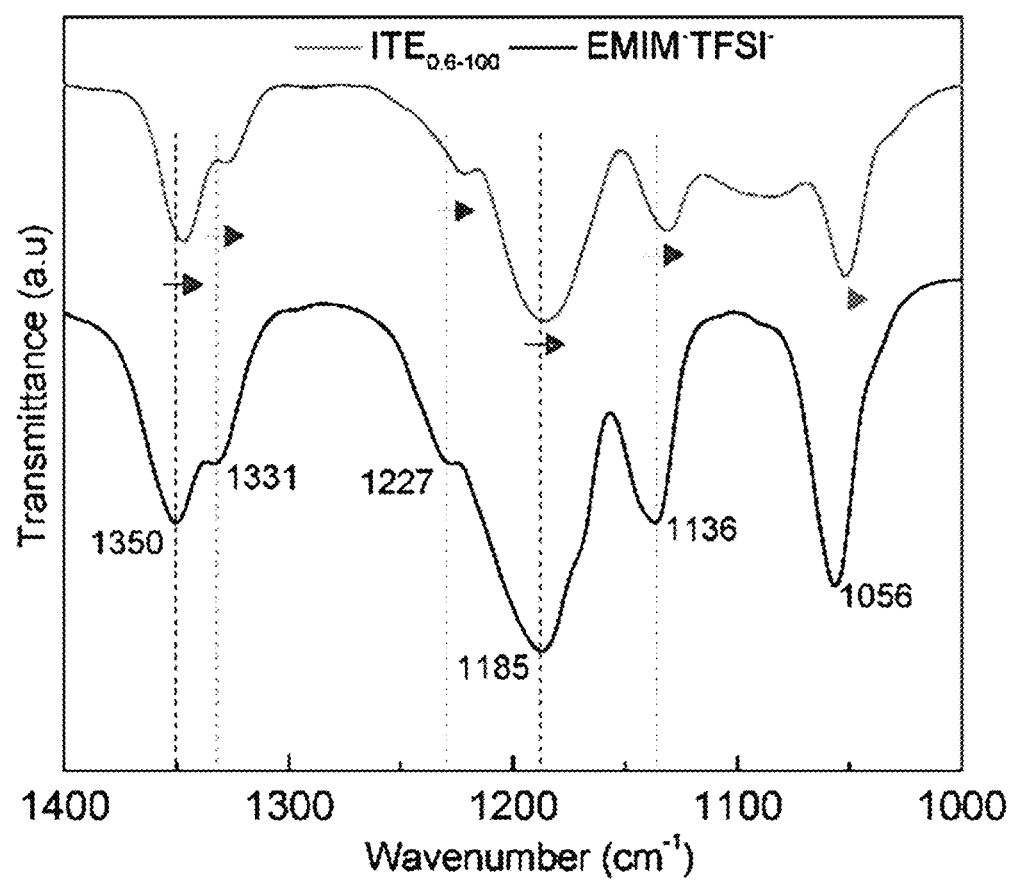
FIG. 2B is a graph illustrating ATR-FTIR transmittance curves for 1-ethyl-3-methylimidazolium bis(trifluoromethylsulfonyl)imide ($EMIM^+TFSI^-$) and an ion thermoelectric elastomer ($ITE_{0.6-100}$).
Figure 2C:
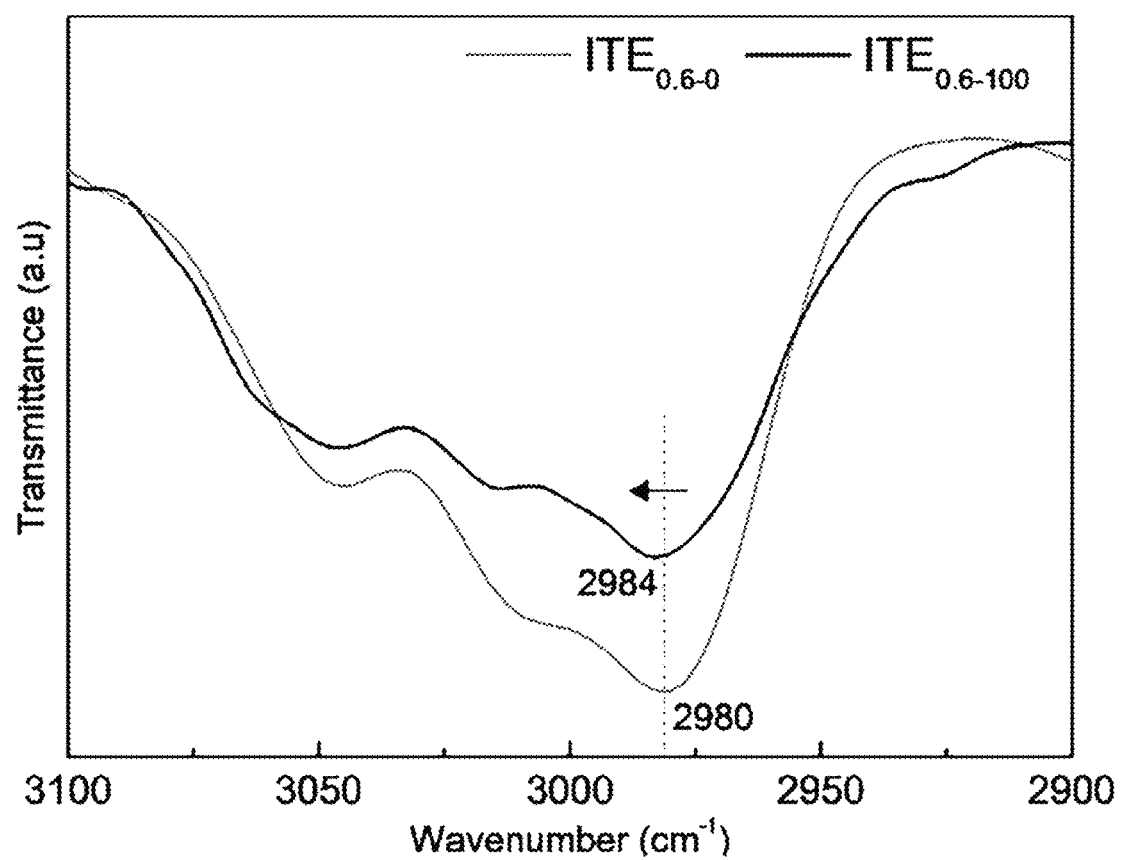
FIG. 2C is a graph illustrating ATR-FTIR transmittance curves for the ion thermoelectric elastomer ($ITE_{0.6-100}$) with the $EMIM^+TFSI^-$ and the ion thermoelectric elastomer ($ITE_{0.6-0}$) without the $EMIM^+TFSI^-$.

FIG. 2B is a graph illustrating ATR-FTIR transmittance curves for the EMIM+TFSI− and the ion thermoelectric elastomer (ITE$_{0.6\text{-}100}$).

Referring to FIG. 2B, the ATR-FTIR analysis result confirmed the presence of a hydrogen bond between the EMIM+TFSI− and the ITE$_{0.6\text{-}100}$. In addition, it was confirmed that characteristic absorption peaks of TFSI− anions were clearly shown in the spectrum of pure EMIM+TFSI−. Specifically, it was confirmed that two SO$_2$ asymmetric bendings (at 1350 cm$^{-1}$ and 1331 cm$^{-1}$), CF$_3$ symmetric bending (at 1227 cm$^{-1}$), CF$_3$ asymmetric bending (at 1185 cm$^{-1}$), SO$_2$ symmetric bending (at 1136 cm$^{-1}$), and S—N—S asymmetric bending (at 1056 cm$^{-1}$) are each assigned.

FIG. 2C is a graph illustrating ATR-FTIR transmittance curves for the ion thermoelectric elastomer (ITE$_{0.6-100}$) with the EMIM$^+$TFSI$^-$ and the ion thermoelectric elastomer (ITE$_{0.6-0}$) without the EMIM$^+$TFSI$^-$.

Referring to FIG. 2C, it was confirmed that a characteristic TFSI$^-$ anion peak in the ITE$_{0.6-100}$ spectrum is shifted to a lower wavenumber, and the CH stretching of the ITE$_{0.6-100}$ spectrum is slightly shifted to a higher wavenumber (2984 cm-1) than that (2980 cm-1) of the ITE$_{0.6-0}$.

Figure 3A:
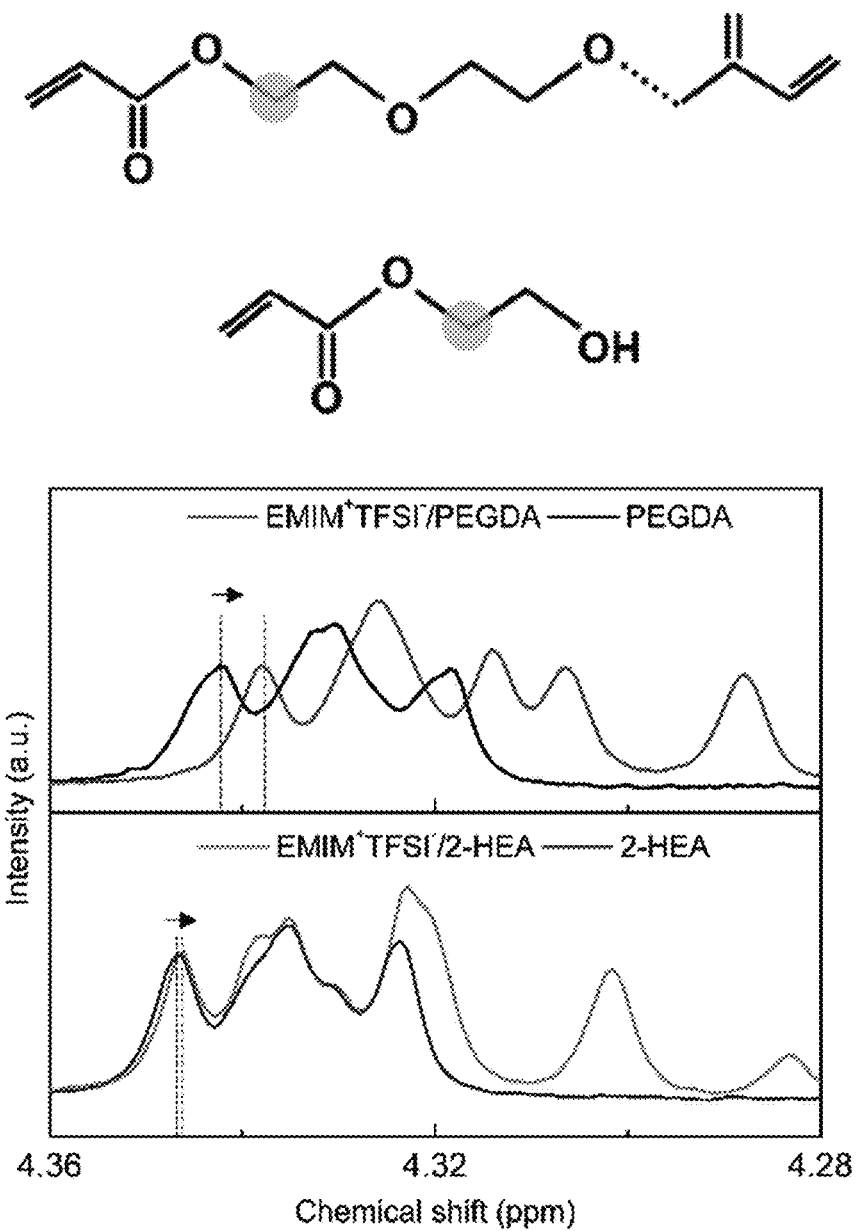
FIG. 3A is a graph illustrating the 4.33 (COO—CH2-, 2H, t) peak of the PEGDA and the 4.34 (COO—CH2-, 2H, t) peak of the 2-HEA.
Figure 3B:
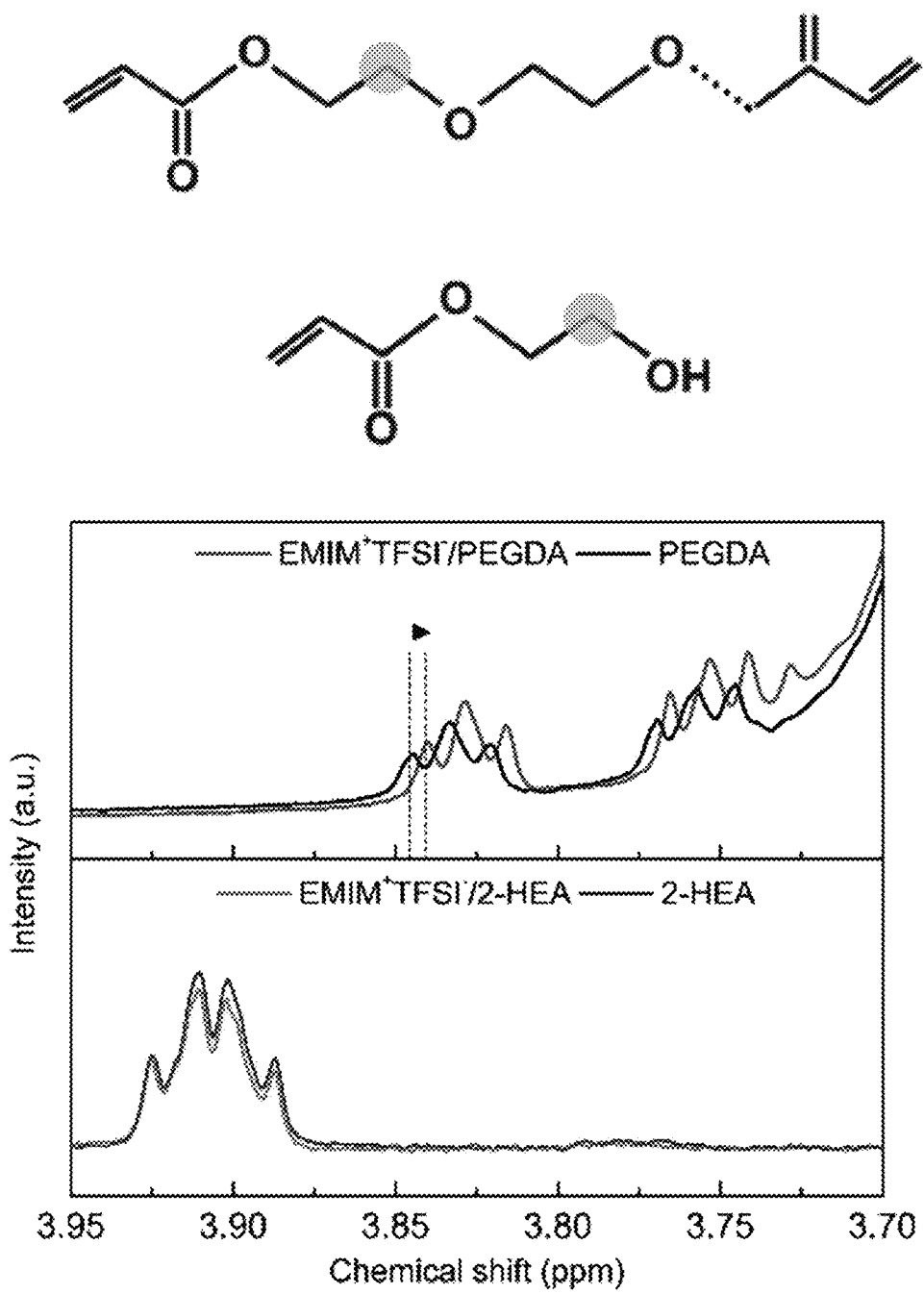
FIG. 3B is a graph illustrating the 3.83 (—CH2-O—, 4H, t) peak of the PEGDA and the 3.91 (—CH2-O—, 2H, t) peak of the 2-HEA.
Figure 3C:
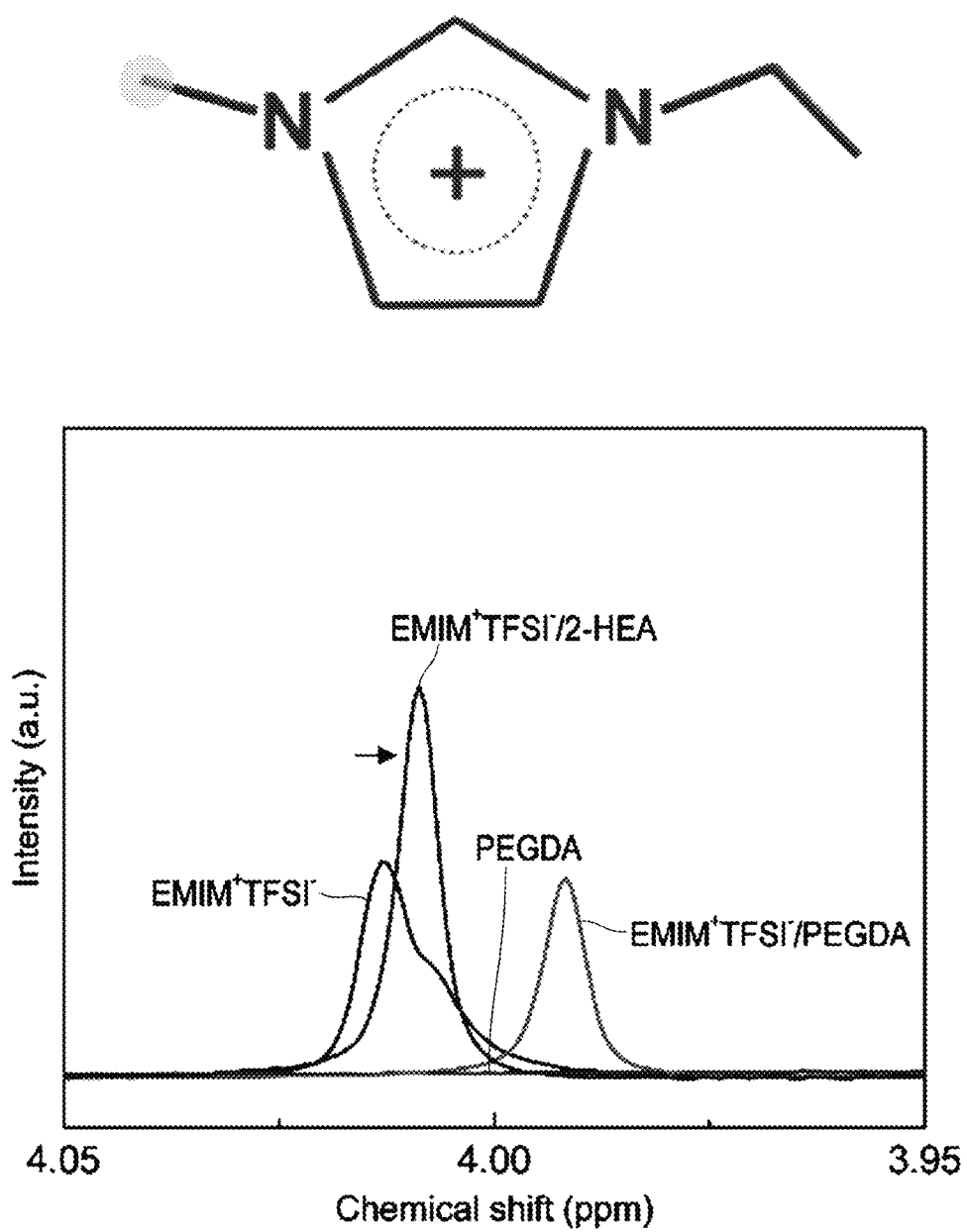
FIG. 3C is a graph illustrating the 4.01 (s, 3H, NCH3) peak of the $EMIM^+TFSI^-$.

FIGS. 3A to 3C are graphs illustrating $^1$H-NMR spectrum results for the PEGDA, the 2-HEA, and the EMIM$^+$TFSI$^-$. Specifically, FIG. 3A is a graph illustrating the 4.33 (COO—CH2-, 2H, t) peak of the PEGDA and the 4.34 (COO—CH2-, 2H, t) peak of the 2-HEA, FIG. 3B is a graph illustrating the 3.83 (—CH2-O—, 4H, t) peak of the PEGDA and the 3.91 (—CH2-O—, 2H, t) peak of the 2-HEA, and FIG. 3C is a graph illustrating the 4.01 (s, 3H, NCH3) peak of the EMIM$^+$TFSI$^-$.

Referring to FIGS. 3A to 3C, it was confirmed that, as a result of $^1$H-NMR analysis, the PEGDA significantly contributed to the dissociation of EMIM$^+$TFSI$^-$than 2-HEA due to the large chemical shifts induced by magnetic shielding. In addition, it was confirmed that electronegative atoms such as N, O, and F of TFSI$^-$ anions can chemically partially interact with positive H atoms of the synthesized ion thermoelectric elastomer, and EMIM$^+$ cations can form a hydrogen bond with O atoms of the PEGDA. In addition, the formed hydrogen bond has a characteristic of separating EMIM$^+$TFSI$^-$ ion pairs, which can increase the ionic thermoelectric properties.

Figure 4:
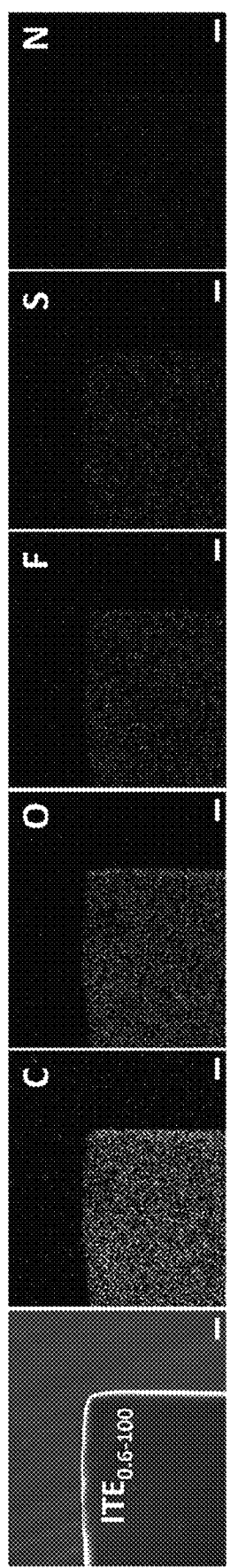
FIG. 4 illustrates images of scanning electron microscope-energy dispersive X-ray spectroscopy (SEM-EDS) results for the ion thermoelectric elastomer ($ITE_{0.6-100}$).

FIG. 4 illustrates images of scanning electron microscope-energy dispersive X-ray spectroscopy (SEM-EDS) results for the ion thermoelectric elastomer (ITE$_{0.6-100}$). Specifically, SEM-EDS was performed using a JEOL 7001F SCM (JEOL Ltd.) after 24 hours of drying surfaces of the ITE$_{0.6-100}$ and the ITE$_{0.6-0}$ in a vacuum oven. As a result, it was confirmed that EMIM$^+$TFSI$^-$ was uniformly present in the ion thermoelectric elastomer (ITE$_{0.6-100}$).

Experimental Example 2: Examining Thermal Stability of Ion Thermoelectric Elastomer FIG. 5 is a graph illustrating thermal gravimetric analysis (TGA) results according to temperature for ion thermoelectric elastomers (ITE$_{0.4-0}$, ITE$_{0.6-0}$, and ITE$_{0.8-0}$) prepared according to Preparation Example.

Specifically, TGA was performed by scanning the ion thermoelectric elastomers (ITE$_{0.4-0}$, ITE$_{0.6-0}$, and ITE$_{0.8-0}$) in a temperature range of 20° C. to 200° C. (10° C. min$^{-1}$) in a dry nitrogen environment using a thermo gravimetric analyzer (Discovery TGA, TA Instruments), and the results are shown in FIG. 5.

Figure 5:
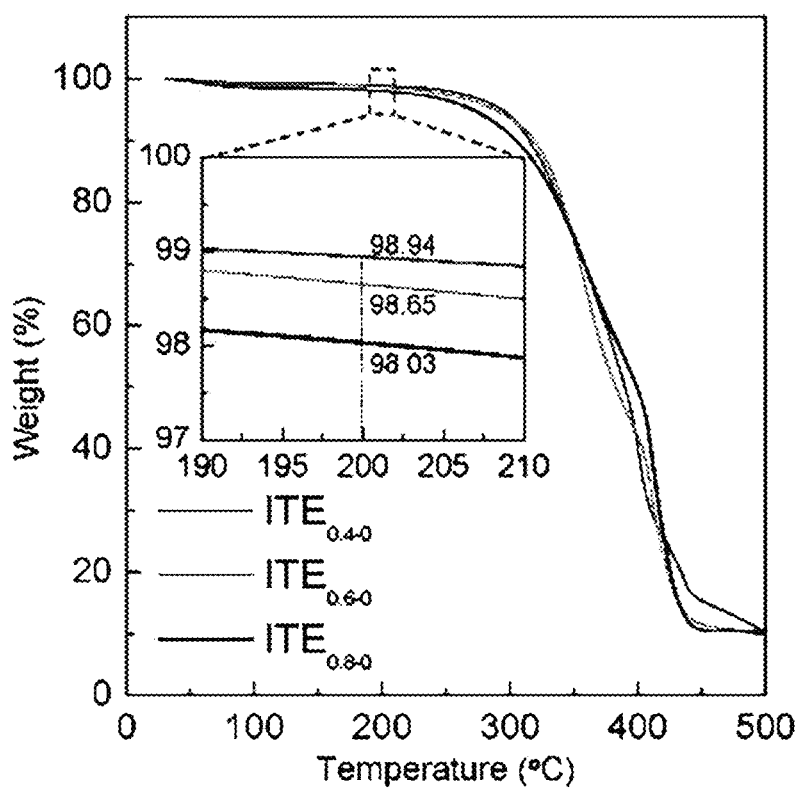
FIG. 5 is a graph illustrating thermal gravimetric analysis (TGA) results according to temperature for ion thermoelectric elastomers ($ITE_{0.4-0}$, $ITE_{0.6-0}$, and $ITE_{0.8-0}$) prepared according to Preparation Example.

Referring to FIG. 5, TGA results for each of the ion thermoelectric elastomers (ITE$_{0.4-0}$, ITE$_{0.6-0}$, and ITE$_{0.8-0}$) confirmed that each of the ion thermoelectric elastomers (ITE$_{0.4-0}$, ITE$_{0.6-0}$, and ITE$_{0.8-0}$) retained less than 2% of its initial weight up to a temperature of 200° C., and this confirms that the ion thermoelectric elastomer according to the present disclosure is more thermally stable than a conventional hydrogel ion conductor, while being dried.

Figure 6A:
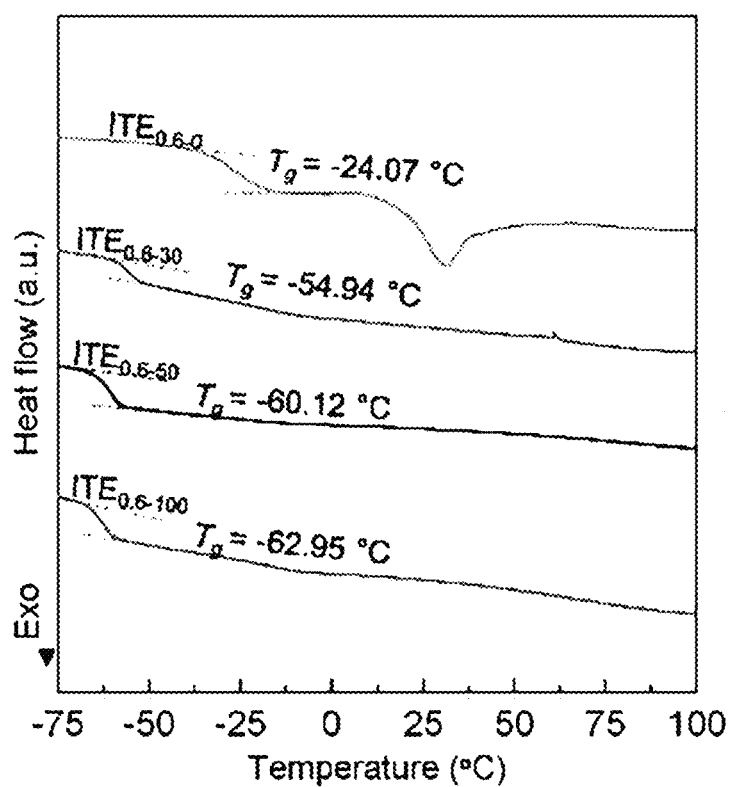
FIG. 6A is a graph illustrating differential scanning calorimetry (DSC) results according to temperature for ion thermoelectric elastomers ($ITE_{0.6-0}$, $ITE_{0.6-30}$, $ITE_{0.6-50}$, and $ITE_{0.6-100}$)) prepared according to Preparation Example.

FIG. 6A is a graph illustrating DSC results according to temperature for ion thermoelectric elastomers (ITE$_{0.6-0}$, ITE$_{0.6-30}$, ITE$_{0.6-50}$, and ITE$_{0.6-100}$) prepared according to Preparation Example.

Figure 6B:
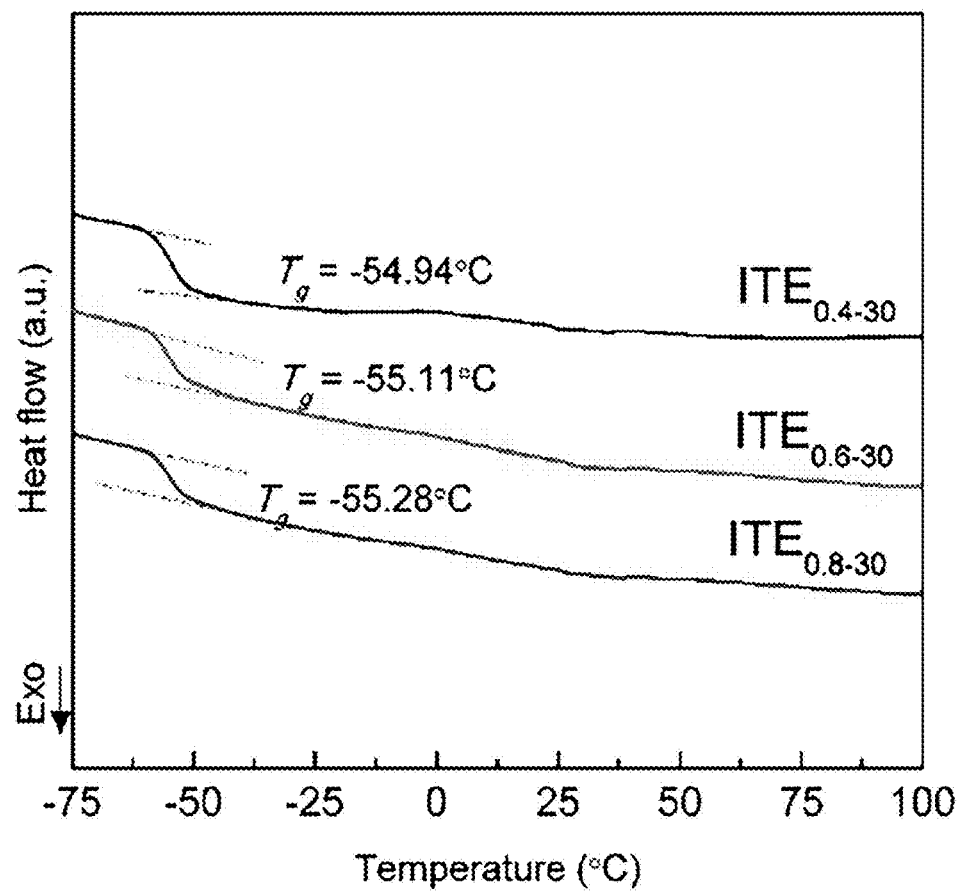
FIG. 6B is a graph illustrating DSC results according to temperature for ion thermoelectric elastomers ($ITE_{0.4-30}$, $ITE_{0.6-30}$, and $ITE_{0.8-30}$) prepared according to Preparation Example.

FIG. 6B is a graph illustrating DSC results according to temperature for ion thermoelectric elastomers (ITE$_{0.4-30}$, ITE$_{0.6-30}$, and ITE$_{0.8-30}$) prepared according to Preparation Example.

Specifically, each ion thermoelectric elastomer was recorded using a differential scanning calorimeter (DSC 8000, Perkin Elmer) at a scan rate of 10 min$^{-1}$ in a nitrogen environment, and the results are shown in FIGS. 6A and 6B.

Referring to FIG. 6A, it was confirmed that a glass transition temperature (Tg) of ITE$_{0.6}$ decreased from −24.07° C. to −62.95° C. as the content of the EMIM$^+$TFSI$^-$ increased due to the plasticizer effect of the EMIM$^+$TFSI$^-$.

In addition, referring to FIG. 6B, it was confirmed that all corresponding ion thermoelectric elastomers including EMIM$^+$TFSI$^-$ exhibited a single Tg in the range of −75° C. to 100° C.

That is, it was confirmed that the ion thermoelectric elastomer according to the present disclosure is thermally stable without phase transition.

Figure 7:
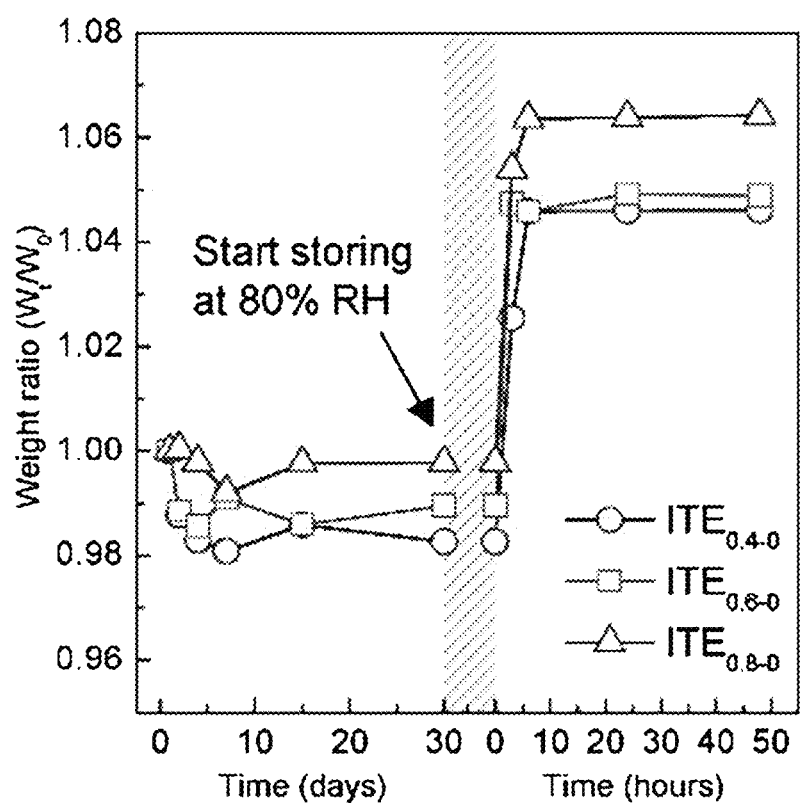
FIG. 7 is a graph illustrating a weight ratio ($W_t/W_0$) as a function of time (days and hours) for the ion thermoelectric elastomers ($ITE_{0.4-0}$, $ITE_{0.6-0}$, and $ITE_{0.8-0}$) prepared according to Preparation Example.

In addition, in order to confirm a retention capacity capable of capturing water molecules (due to the hydroxyl (—OH) groups) in the ion thermoelectric elastomer, a weight ratio ($W_t/W_0$) of the ion thermoelectric elastomer over time ($W_t$ is a weight over time and $W_0$ is an initial weight of the ion thermoelectric elastomer) was examined, and the results are shown in FIG. 7. In this case, in order to remove excess water molecules in the ion thermoelectric elastomer under ambient conditions, the measurement was performed after synthesis and drying for 1 day.

FIG. 7 is a graph illustrating a weight ratio ($W_t/W_0$) as a function of time (days and hours) for the ion thermoelectric elastomers (ITE$_{0.4-0}$, ITE$_{0.6-0}$, and ITE$_{0.8-0}$) prepared according to Preparation Example.

Referring to FIG. 7, it was confirmed that the weights of all the ion thermoelectric elastomers (ITE0.4-0, ITE0.6-0, and ITE0.8-0) were almost unchanged at 20° C. and 50% relative humidity (RH), and a stable water retention capacity of about 99% of the original weight was maintained even after 30 days. In addition, it was confirmed that, even under high humidity (80% RH) conditions, the ion thermoelectric elastomer almost recovered its original weight after 6 hours due to the hydroxyl group (—OH) of the 2-HEA.

Figure 8:
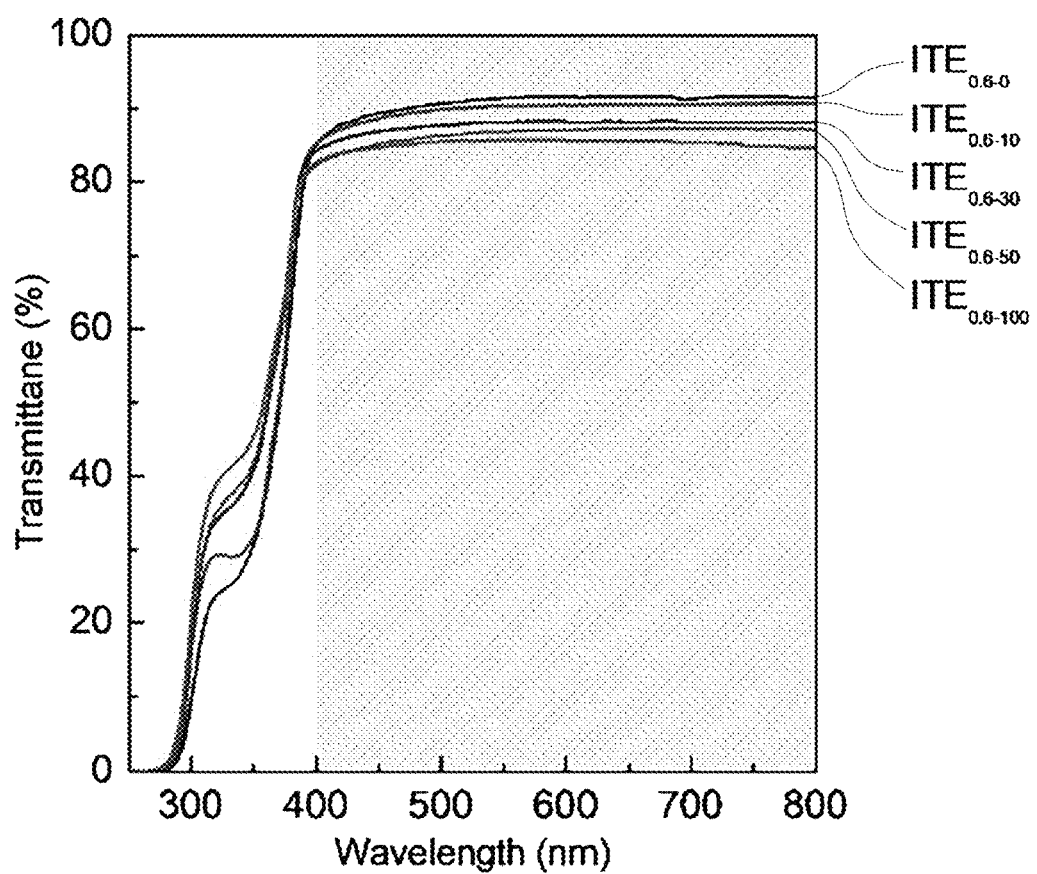
FIG. 8 is a graph illustrating transmittance results as a function of wavelength for ion thermoelectric elastomers ($ITE_{0.6-0}$, $ITE_{0.6-30}$, $ITE_{0.6-50}$, and $ITE_{0.6-100}$) prepared according to Preparation Example with an increasing content of $EMIM^+TFSI^-$.

FIG. 8 is a graph illustrating transmittance results as a function of wavelength for the ion thermoelectric elastomers (ITE$_{0.6-0}$, ITE$_{0.6-30}$, ITE$_{0.6-50}$, and ITE$_{0.6-100}$) prepared according to Preparation Example with an increasing content of EMIM$^+$TFSI$^-$. Specifically, the transmittance was measured using a UV-visible light spectrometer (V-650, JASCO) in a range of 250 to 800 nm.

Referring to FIG. 8, it was confirmed that the ion thermoelectric elastomer showed transmittance values higher than 80% in the visible light range of 400 to 800 nm regardless of the EMIM$^+$TFSI$^-$ content.

Figure 9:
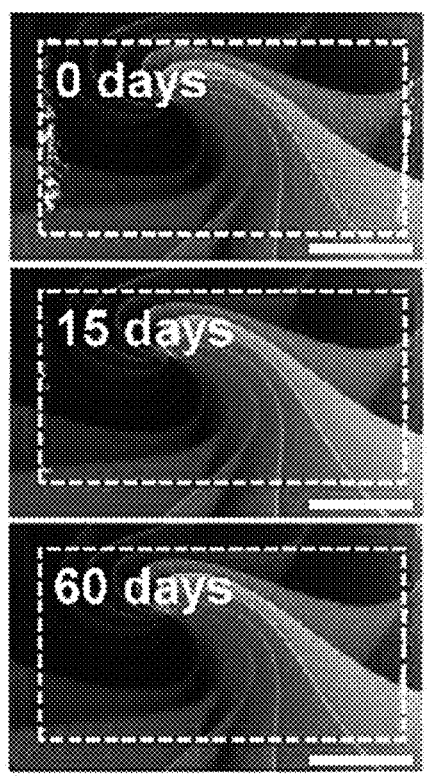
FIG. 9 illustrates images of the ion thermoelectric elastomer ($ITE_{0.6-100}$) prepared according to Preparation Example after exposure to air (50% relative humidity (RH), 20° C.) for 60 days.

FIG. 9 illustrates images of the ion thermoelectric elastomer (ITE$_{0.6-100}$) prepared according to Preparation Example after exposure to air (50% RH, 20° C.) for 60 days.

Referring to FIG. 9, it was confirmed that the ion thermoelectric elastomer (ITE$_{0.6-100}$) maintained its original shape without significant shape change even after more than 8 weeks.

That is, based on the above results, it was confirmed that the ion thermoelectric elastomer according to the present disclosure exhibited better thermal and air stability than a conventional hydrogel.

Figure 10:
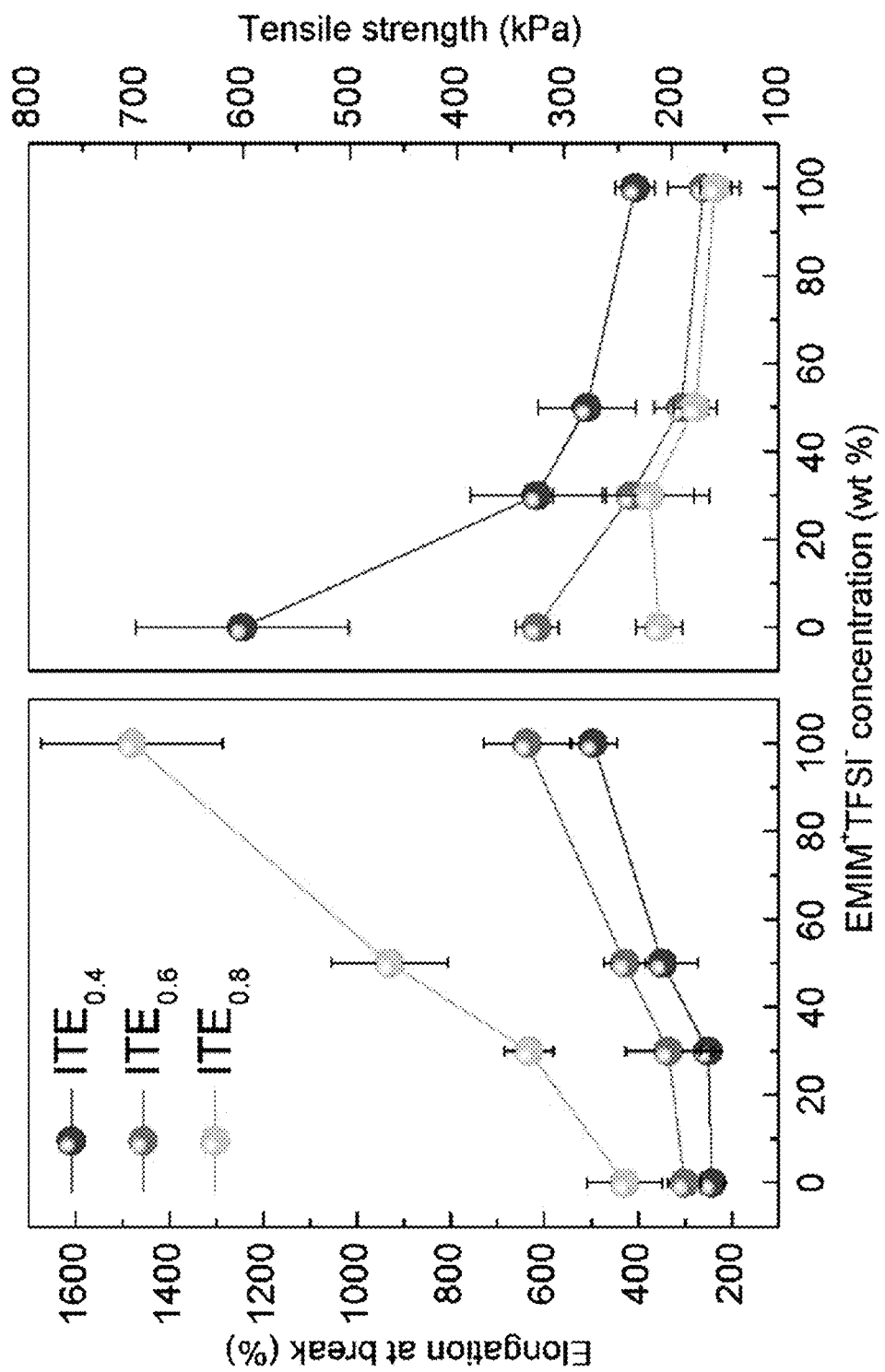
FIG. 10 is a graph of measurement results for elongation at break and tensile strength of the ion thermoelectric elastomer prepared according to Preparation Example.

Experimental Example 3: Examination of Mechanical Properties of Ion Thermoelectric Elastomer FIG. 10 is a graph of measurement results for elongation at break and tensile strength of the ion thermoelectric elastomer prepared according to Preparation Example. Specifically, FIG. 10 is a graph of the measurement results for the elongation at break and tensile strength of each of ion thermoelectric elastomers ($ITE_{0.4-0}$, $ITE_{0.4-30}$, $ITE_{0.4-50}$, and $ITE_{0.4-100}$), the ion thermoelectric elastomers ($ITE_{0.6-0}$, $ITE_{0.6-30}$, $ITE_{0.6-50}$, and $ITE_{0.6-100}$), and ion thermoelectric elastomers ($ITE_{0.8-0}$, $ITE_{0.8-30}$, $ITE_{0.8-50}$, and $ITE_{0.8-100}$). In this case, the ion thermoelectric elastomer was cut to a size of $1 \times 2$ cm$^2$, and a thickness thereof was measured using a digimatic thickness gauge (Mitutoyo) and measured with a uniaxial tensile machine (Mecmeshine, ION load cell) at a tensile speed of 10 mmmin$^{-1}$.

In addition, referring to FIG. 10, it was confirmed that as the PEGDA concentration decreases, the elongation at break of the ion thermoelectric elastomer increased from 242±25% ($ITE_{0.4-0}$) to 428±80% ($ITE_{0.8-0}$) and the tensile strength decreased from 600.71±100 kPa ($ITE_{0.4-0}$) to 211.51±21 kPa ($ITE_{0.8-0}$). Through this, it was confirmed that as the PEGDA concentration decreases, the light chain portion of the PEGDA, which acts as a chemical crosslinker, decreased, thereby changing the mechanical properties of the ion thermoelectric elastomer.

In addition, referring to FIG. 10, it was confirmed that the stretchability of the ion thermoelectric elastomer increased with the increase in the content of $EMIM^+TFSI^-$, and in particular, $ITE_{0.8-100}$ has the highest stretchability at a strain of 1480±195%. In addition, it was confirmed that the tensile strength of the ion thermoelectric elastomer decreased with the increase in the content of $EMIM^+TFSI^-$. Through this, it was confirmed that as the content of $EMIM^+TFSI^-$ increases, the stretchability increased due to the plasticizer effect and the ability of $EMIM^+TFSI^-$, thereby reducing the network density of the PEGDA.

Figure 11:
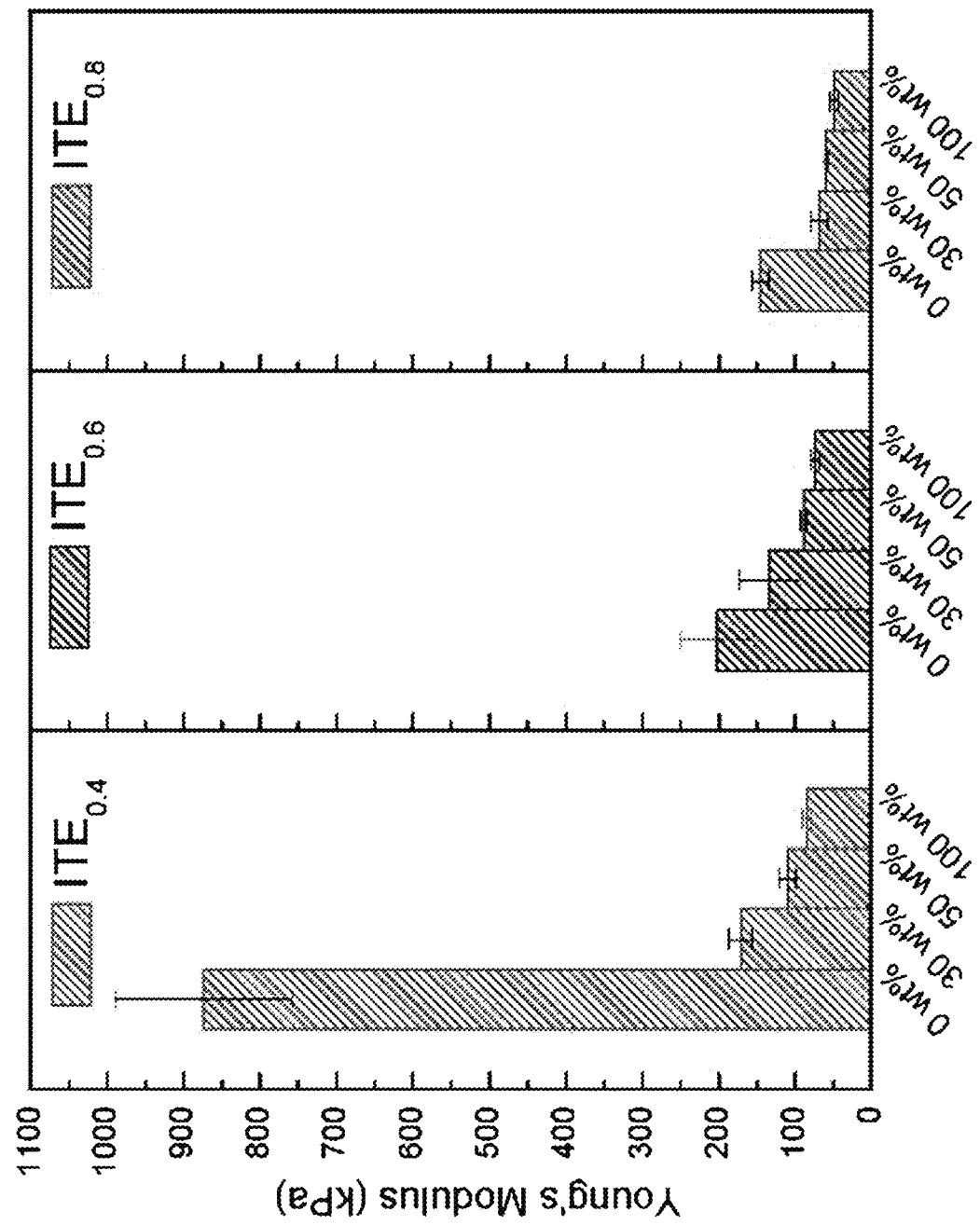
FIG. 11 is a graph of measurement results for Young's modulus according to the content of $EMIM^+TFSI^-$ for the ion thermoelectric elastomers prepared according to Preparation Example.

FIG. 11 is a graph of measurement results for Young's modulus according to the content of $EMIM^+TFSI^-$ for the ion thermoelectric elastomers prepared according to Preparation Example.

Referring to FIG. 11, it was confirmed that the Young's modulus of the ion thermoelectric elastomer decreased with the increase in the content of $EMIM^+TFSI^-$, and the Young's modulus of most of the ion thermoelectric elastomers is less than 250 kPa, which is similar to the value of biological tissue (140-600 kPa). Accordingly, it was confirmed that the ion thermoelectric elastomer according to the present disclosure can be used in a wearable device capable of harvesting even low energy by being mounted on human skin.

Figure 12A:
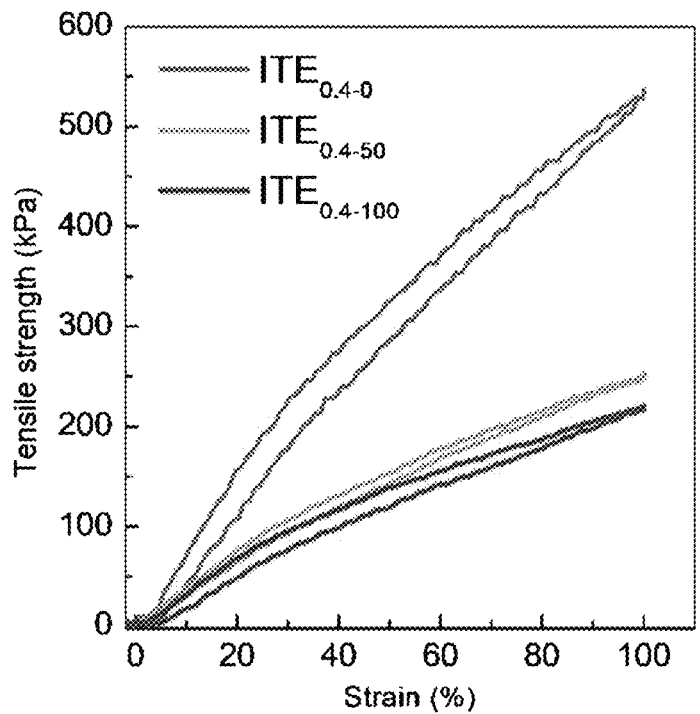
FIG. 12A is a graph illustrating hysteresis curves for ion thermoelectric elastomers ($ITE_{0.4-0}$, $ITE_{0.4-50}$, and $ITE_{0.4-100}$)
Figure 12B:
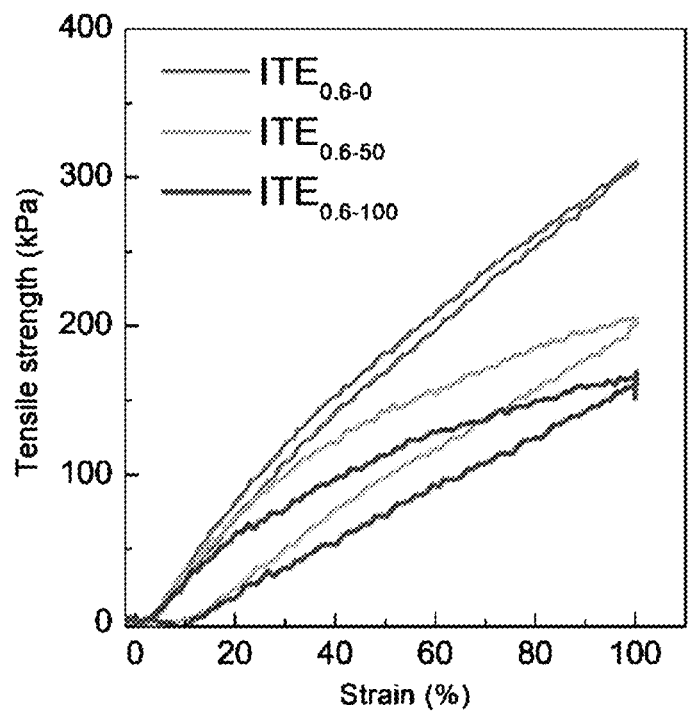
FIG. 12B is a graph illustrating hysteresis curves for the ion thermoelectric elastomer ($ITE_{0.6-0}$, $ITE_{0.6-50}$, and $ITE_{0.6-100}$)
Figure 12C:
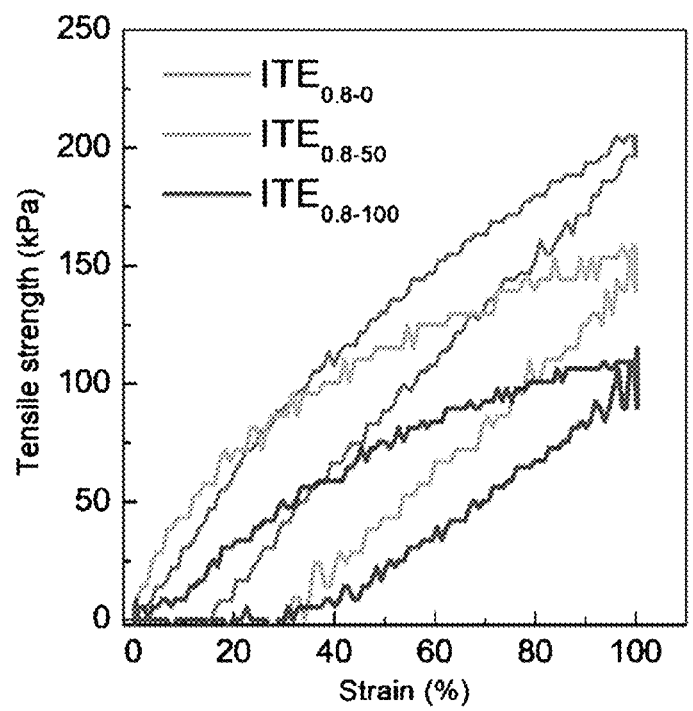
FIG. 12C is a graph illustrating hysteresis curves for ion thermoelectric elastomers ($ITE_{0.8-0}$, $ITE_{0.8-50}$, and $ITE_{0.8-100}$)
Figure 12D:
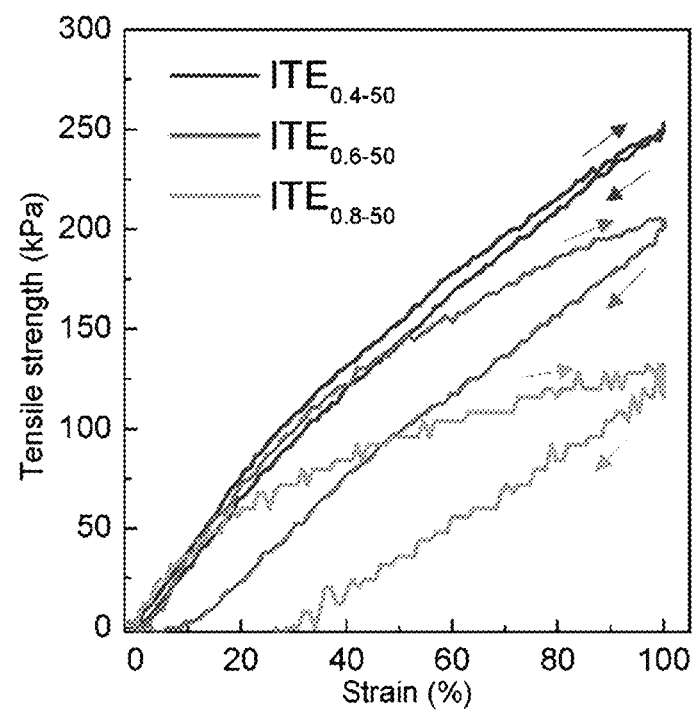
FIG. 12D is a graph illustrating hysteresis curves for ion thermoelectric elastomers ($ITE_{0.4-50}$, $ITE_{0.6-50}$, and $ITE_{0.8-50}$).

FIGS. 12A to 12D are graphs illustrating hysteresis curves for the ion thermoelectric elastomers prepared according to Preparation Example in a loading/unloading process up to a maximum 100% strain level. Specifically, FIG. 12A is a graph illustrating hysteresis curves for ion thermoelectric elastomers ($ITE_{0.4-0}$, $ITE_{0.4-50}$, and $ITE_{0.4-100}$), FIG. 12B is a graph illustrating hysteresis curves for ion thermoelectric elastomers ($ITE_{0.6-0}$, $ITE_{0.6-50}$, and $ITE_{0.6-100}$), FIG. 12C is a graph illustrating hysteresis curves for ion thermoelectric elastomers ($ITE_{0.8-0}$, $ITE_{0.8-50}$, and $ITE_{0.8-100}$), and FIG. 12D is a graph illustrating hysteresis curves for ion thermoelectric elastomers ($ITE_{0.4-50}$, $ITE_{0.6-50}$, and $ITE_{0.8-50}$).

Referring to FIG. 12A, it was confirmed that in the case of the ion thermoelectric elastomer ($ITE_{0.4-0}$), no noticeable residual deformation was observed during the cycle regardless of the $EMIM^+TFSI^-$ concentration, and this confirmed that the ion thermoelectric elastomer ($ITE_{0.4-0}$) exhibited a stable mechanical stretchability after stretching and releasing. As such, the clear absence of residual strain confirmed that the hydrogen bond between the $EMIM^+TFSI^-$ and the polymer matrix was effectively maintained.

Meanwhile, referring to FIG. 12D, it was confirmed that in the case of the ion thermoelectric elastomer with decreasing PEGDA content and constant $EMIM^+TFSI^-$ concentration, $ITE_{0.6-50}$ exhibited a negligible residual strain of less than 5%, whereas in the case of $ITE_{0.8-50}$, the residual strain increased to about 30% due to insufficient PEGDA network formation.

In addition, referring to FIG. 12C, it was confirmed that $ITE_{0.8-50}$ and $ITE_{0.8-100}$ exhibited viscoelastic deformation during the loading/unloading cycle at 100% strain.

Figure 13A:
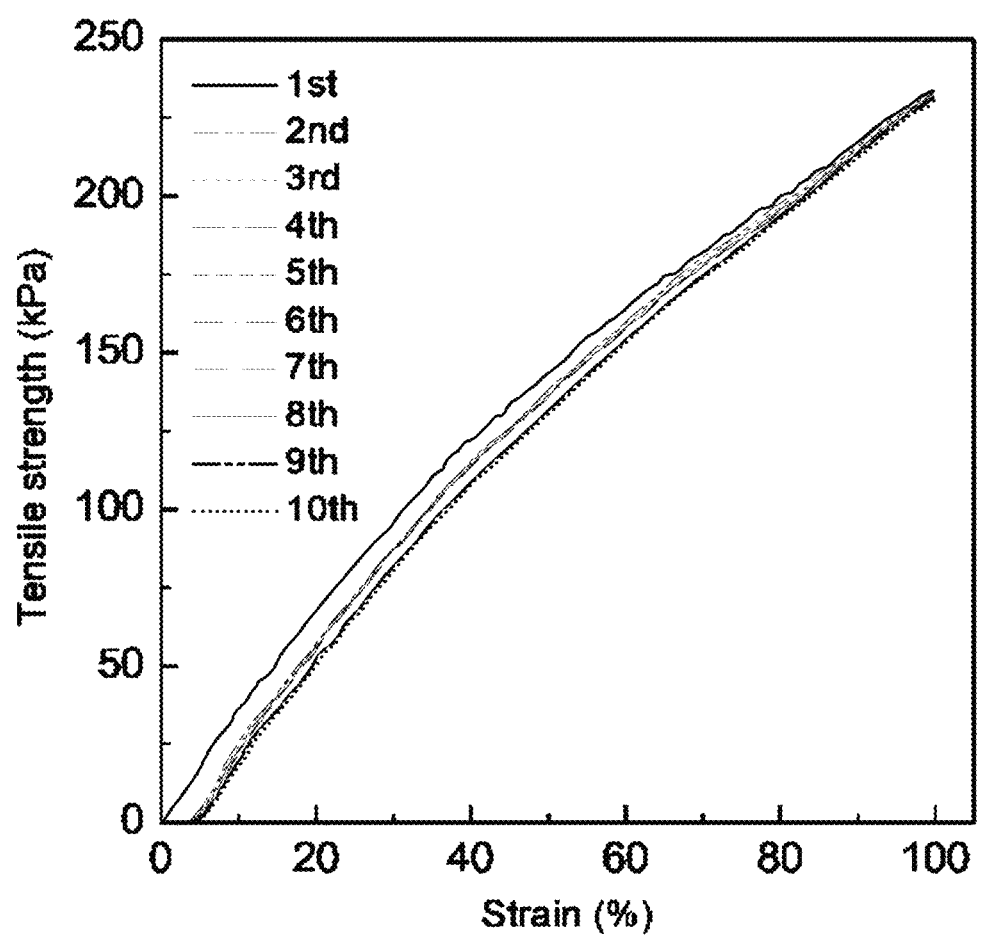
FIGS. 13A to 13C are graphs illustrating hysteresis curves for the ion thermoelectric elastomers ($ITE_{0.4-50}$ in the case of FIG. 13A, $ITE_{0.6-50}$ in the case of FIG. 13B, and $ITE_{0.8-50}$ in the case of FIG. 13C) over 10 consecutive loading/unloading cycles.
Figure 13B:
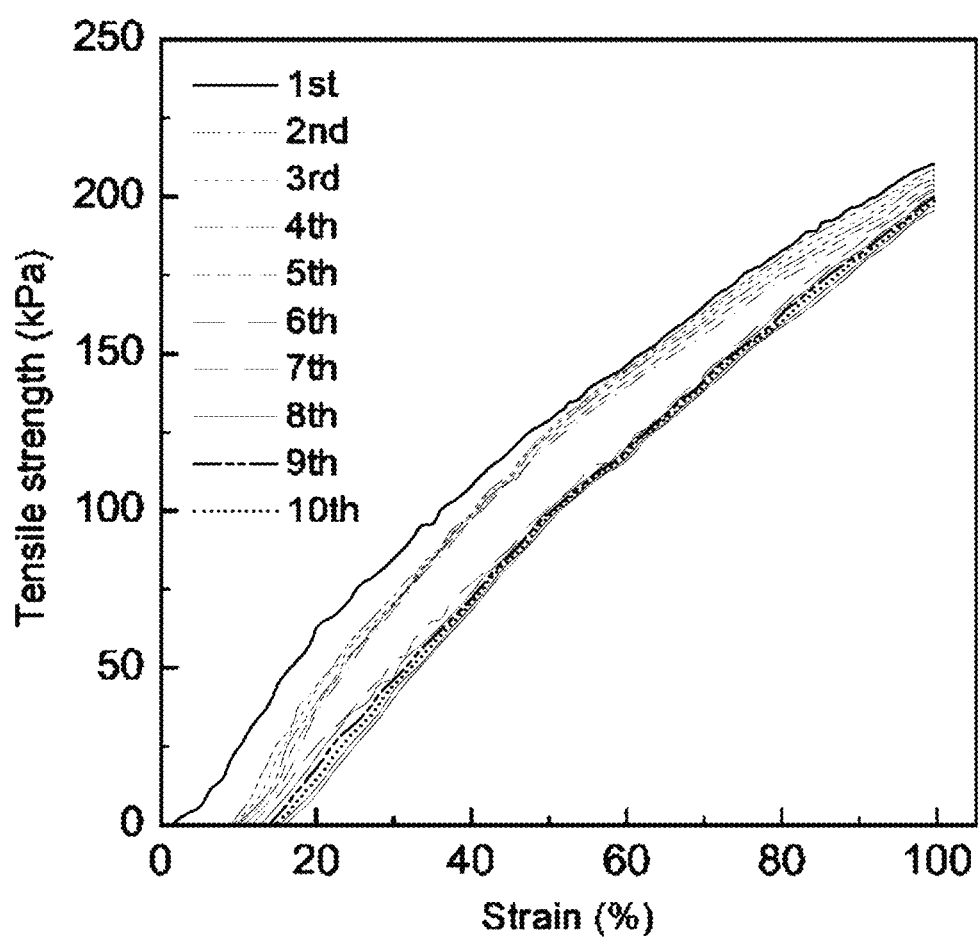
Figure 13C:
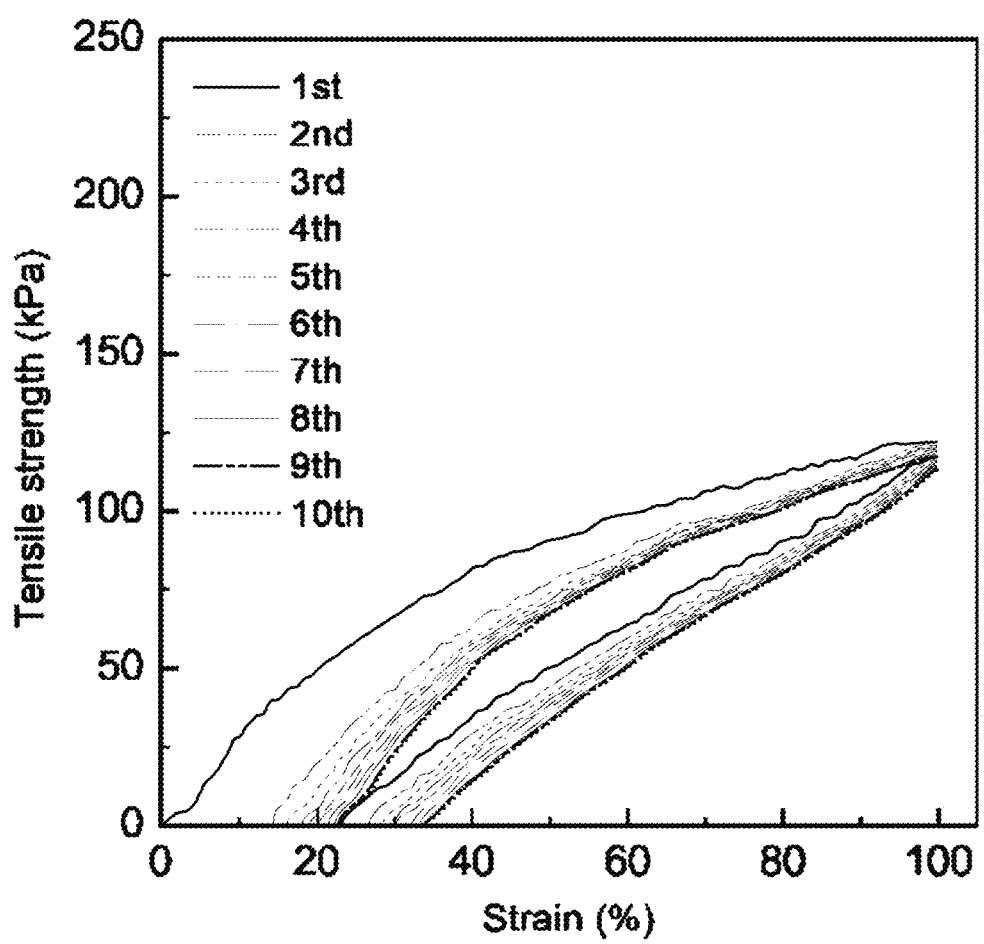

FIGS. 13A to 13C are graphs illustrating hysteresis curves for the ion thermoelectric elastomers ($ITE_{0.4-50}$ in the case of FIG. 13A, $ITE_{0.6-50}$ in the case of FIG. 13B, and $ITE_{0.8-50}$ in the case of FIG. 13C) over 10 consecutive loading/unloading cycles.

Referring to the above, $ITE_{0.6-50}$ and $ITE_{0.8-50}$ showed residual deformation in the first loading/unloading cycle, but a negligible hysteresis curve appeared in 10 consecutive loading/unloading cycles, and this confirmed that an elastic behavior was possible in the case of $ITE_{0.6-50}$ and $ITE_{0.8-50}$ after the first cycle.

Figure 14A:
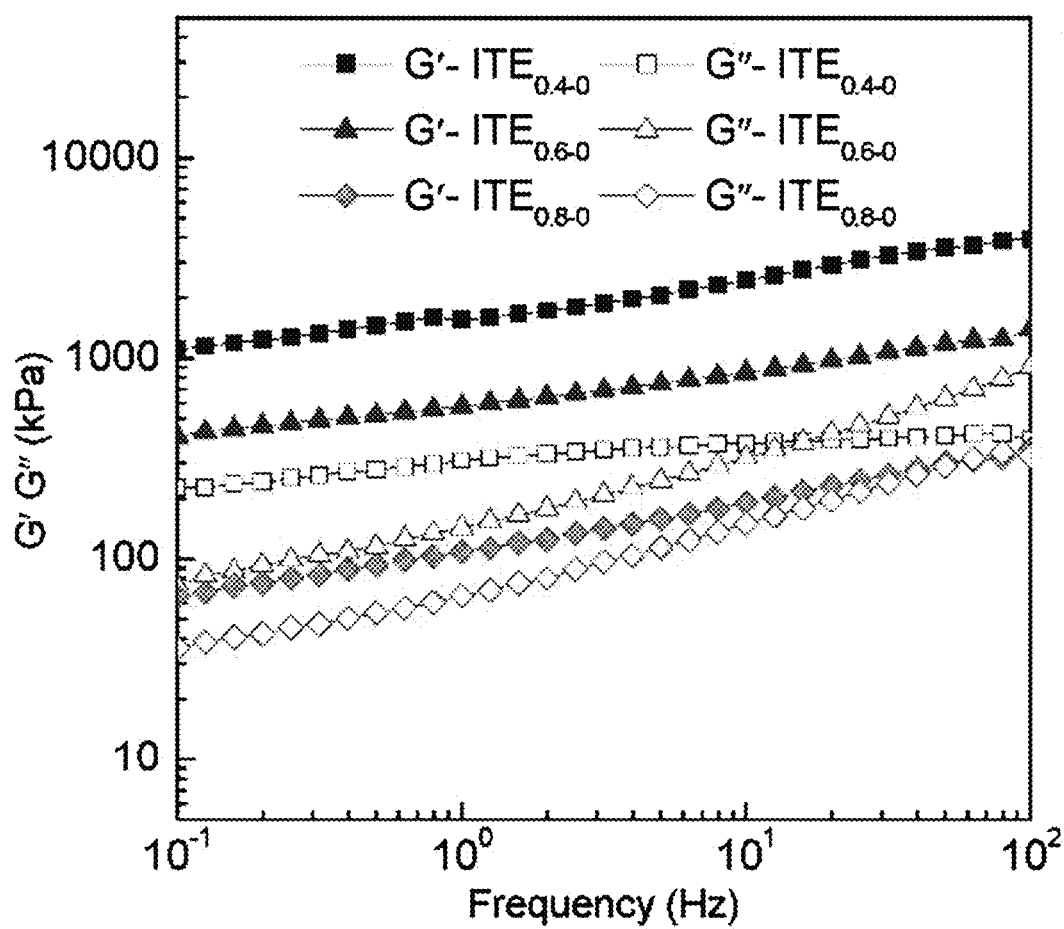
FIG. 14A is a graph illustrating the dependence of a storage modulus G' and a loss modulus G" as a function of a change in frequency (less than 1% strain) for the ion thermoelectric elastomers ($ITE_{0.4-0}$, $ITE_{0.6-0}$, and $ITE_{0.8-0}$) prepared according to Preparation Example.

FIG. 14A is a graph illustrating the dependence of a storage modulus G' and a loss modulus G" as a function of a change in frequency (less than 1% strain) for the ion thermoelectric elastomers ($ITE_{0.4-0}$, $ITE_{0.6-0}$, and $ITE_{0.8-0}$) prepared according to Preparation Example. In this case, rheology measurements to determine the storage modulus G' and the loss modulus G" were performed using a rotational rheometer (ARES-G2, TA instruments) in a plate-to-plate configuration over a frequency range of $10^{-1}$ Hz to $10^2$ Hz (25° C., 1% strain). In particular, rheology measurements for the ion thermoelectric elastomers were performed using dynamic mechanical analysis (Q800, TA instruments) that uses uniaxial tensile geometry.

Referring to FIG. 14A, the rheology measurement results confirmed that $ITE_{0.4-0}$ and $ITE_{0.6-0}$ exhibited elastic gel behavior since the storage modulus G' is much larger than the loss modulus G" in the frequency range of $10^{-1}$ Hz to $10^2$ Hz at a temperature of 25° C. However, it was confirmed that $ITE_{0.8-0}$ exhibited a decrease in the ratio of storage modulus to loss modulus, and this confirmed an increase in viscosity deformation compared to other ITEs. At this time, it was confirmed that $ITE_{0.8-0}$ included a small amount of PEGDA and thus had a relatively reduced storage volume due to the low crosslinking density.

Figure 14B:
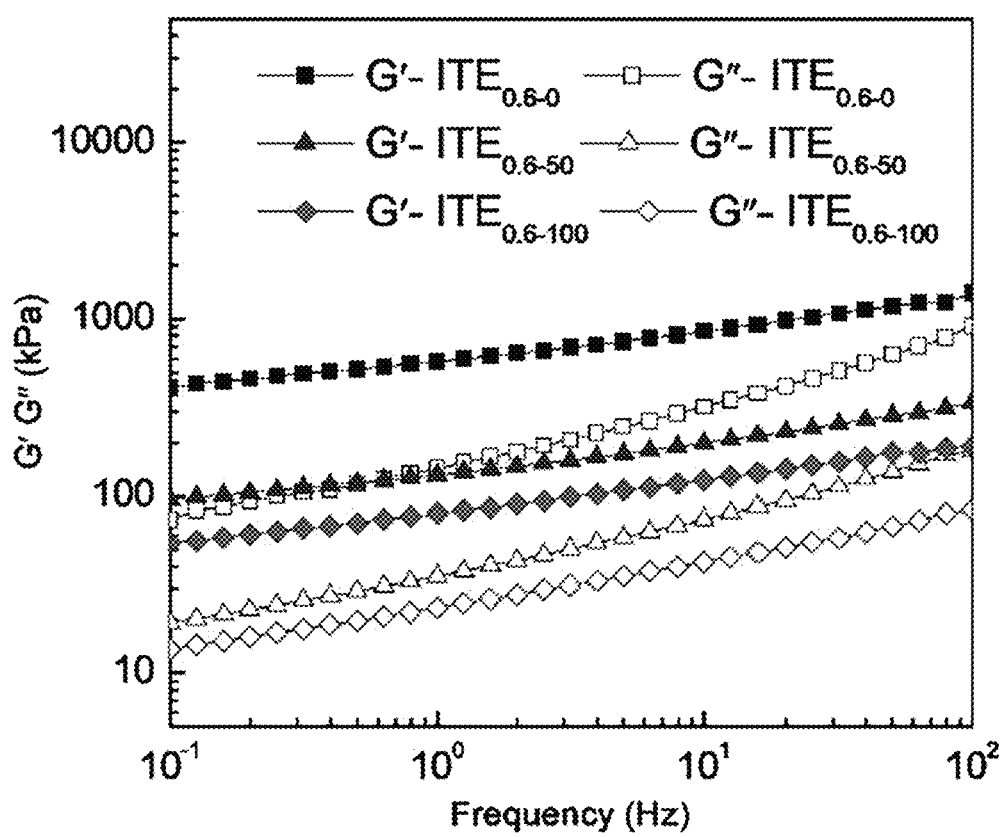
FIG. 14B is a graph illustrating the dependence of the storage modulus G' and the loss modulus G" as a function of a change in frequency (less than 1% strain) for the ion thermoelectric elastomers ($ITE_{0.6-0}$, $ITE_{0.6-50}$, and $ITE_{0.8-100}$) prepared according to Preparation Example.

FIG. 14B is a graph illustrating the dependence of the storage modulus G' and the loss modulus G" as a function of a change in frequency (less than 1% strain) for the ion thermoelectric elastomers ($ITE_{0.6-0}$, $ITE_{0.6-50}$, and $ITE_{0.8-100}$) prepared according to Preparation Example.

Referring to FIG. 14B, it was confirmed that the storage modulus of $ITE_{0.6}$ decreased when the $EMIM^+TFSI^-$ content increased from 0 wt % to 100 wt %, and this confirmed that $EMIM^+TFSI^-$ can reduce the internal network density of the PEGDA and the 2-HEA.

Figure 14C:
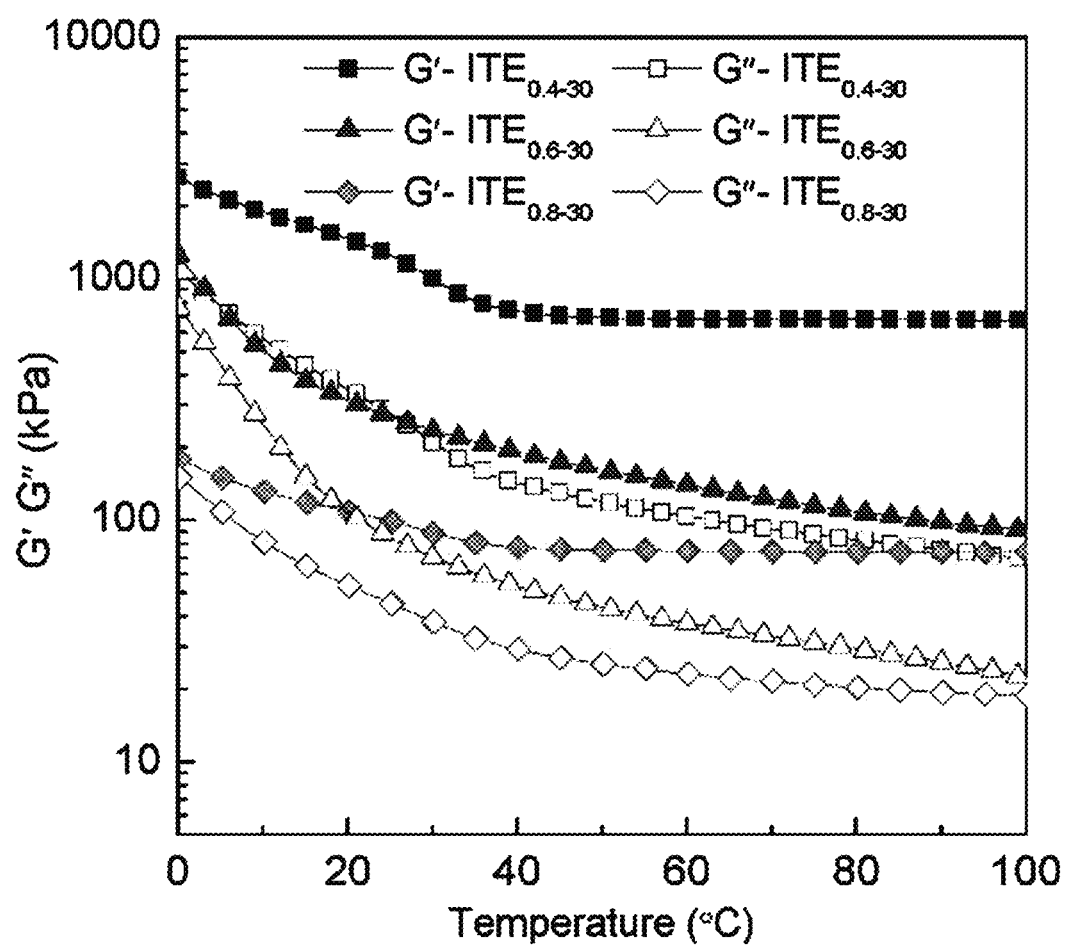
FIG. 14C is a graph obtained by dynamic mechanical analysis of the storage modulus G' and the loss modulus G" as a function of a change in temperature for the ion thermoelectric elastomers ($ITE_{0.4-30}$, $ITE_{0.6-30}$, and $ITE_{0.8-30}$) prepared according to Preparation Example.

FIG. 14C is a graph obtained by dynamic mechanical analysis of the storage modulus G' and the loss modulus G" as a function of a change in temperature for the ion thermoelectric elastomers ($ITE_{0.4-30}$, $ITE_{0.6-30}$, and $ITE_{0.8-0}$) prepared according to Preparation Example.

Referring to FIG. 14C, it was confirmed that when heated above 0° C., all the ion thermoelectric elastomers softened and maintained their elastic mechanical properties without melting and phase transition.

That is, the ion thermoelectric elastomers according to the present disclosure have adjustable mechanical properties by adjusting the initial content of PEGDA and EMIM$^+$TFSI$^-$, and as a result, the ion thermoelectric elastomers can be prepared to allow excellent mechanical deformation without breakage even under tensile stretching.

Experimental Example 4: Examination of Ionic Thermoelectric Performance of Ion Thermoelectric Elastomer An output voltage of the ion thermoelectric elastomer may be generated through the diffusion of mobile ions generated by the Soret effect due to a specific temperature gradient. In this case, the output voltage of the ion thermoelectric elastomer is related to a heat transfer (Q*), which can be derived from an ion transport equation as shown in Equation 1 below, $$\alpha = Q^*/2FT \quad \text{[Equation 1]}$$

where, α is the Seebeck coefficient, F is the Faraday constant, and T is the absolute temperature.

By imposing specific interactions between the polymer matrix and the ion conductive dopant, it is possible to increase the heat transfer (Q*) (output voltage). Specifically, according to Experimental Example 1, the hydrogen bond between the EMIM$^+$TFSI$^-$ and the polymer matrix can thermally shift the EMIM$^+$TFSI$^-$ due to the Soret effect, thereby generating a steady-state potential difference.

Figure 15A:
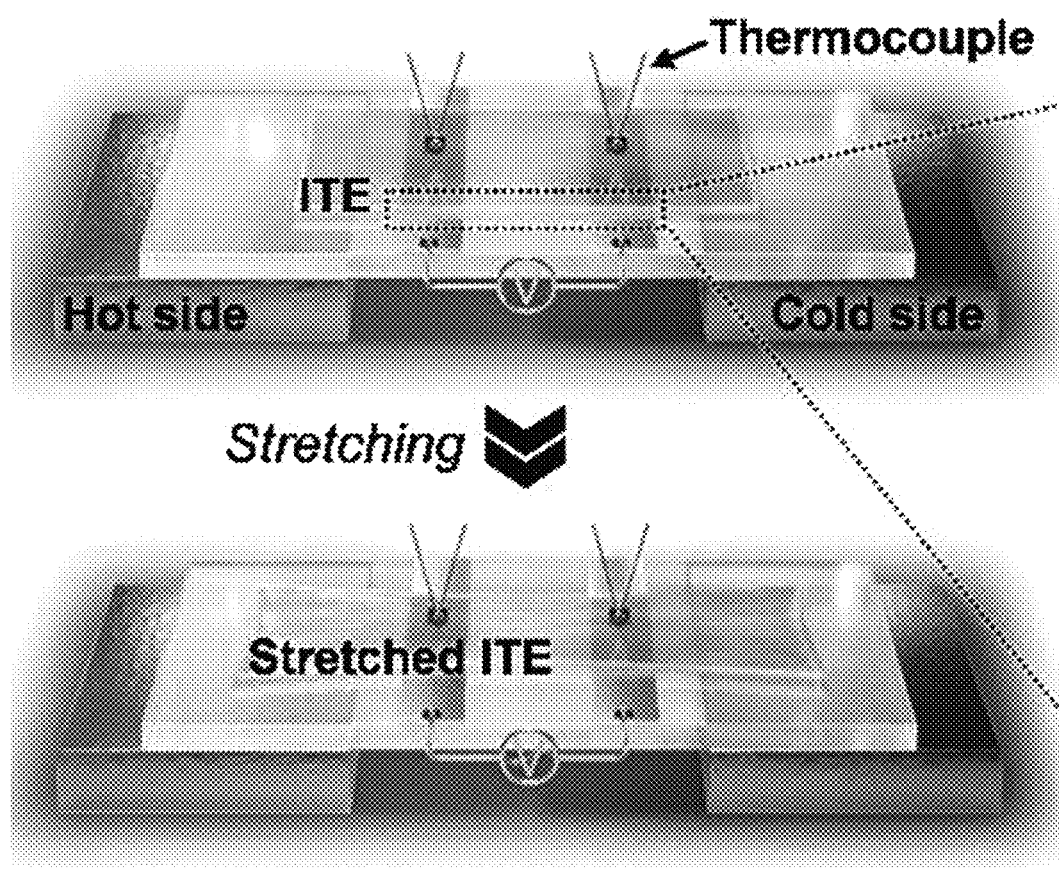
FIG. 15A is a schematic view for measuring an output voltage and an ionic conductivity in a normal state (top)/a stretched state (bottom) of the ion thermoelectric elastomer prepared according to Preparation Example.

FIG. 15A is a schematic view for measuring an output voltage and an ionic conductivity in a normal state (top)/a stretched state (bottom) of the ion thermoelectric elastomer prepared according to Preparation Example.

Referring to FIG. 15A, the output voltage was measured from a parallel configuration in which the ion thermoelectric elastomer is disposed on an Au electrode at an interval of 5 mm, and at this time, two Peltier devices (TEC1-12706) generated a temperature gradient across the ion thermoelectric elastomer (ITE) through a thermocouple. At this time, a current flowing through the Peltier devices could be adjusted in the range of −0.3 A to +0.3 A through a Keithley 2000 sourcemeter, and the output voltage corresponding to the temperature gradient was recorded through a Keithley 2000 Multimeter. Meanwhile, the thermocouple was of T-type and the temperature gradient was measured along the in-plane interval of the Au electrode after a saturation time. At this time, humidity-dependent output voltage measurement was performed in an acrylic chamber, and the humidity inside the chamber was automatically controlled by an Arduino and a hygrometer. Accordingly, the output voltages of various ITEs for the specific temperature gradient were obtained.

Figure 15B:
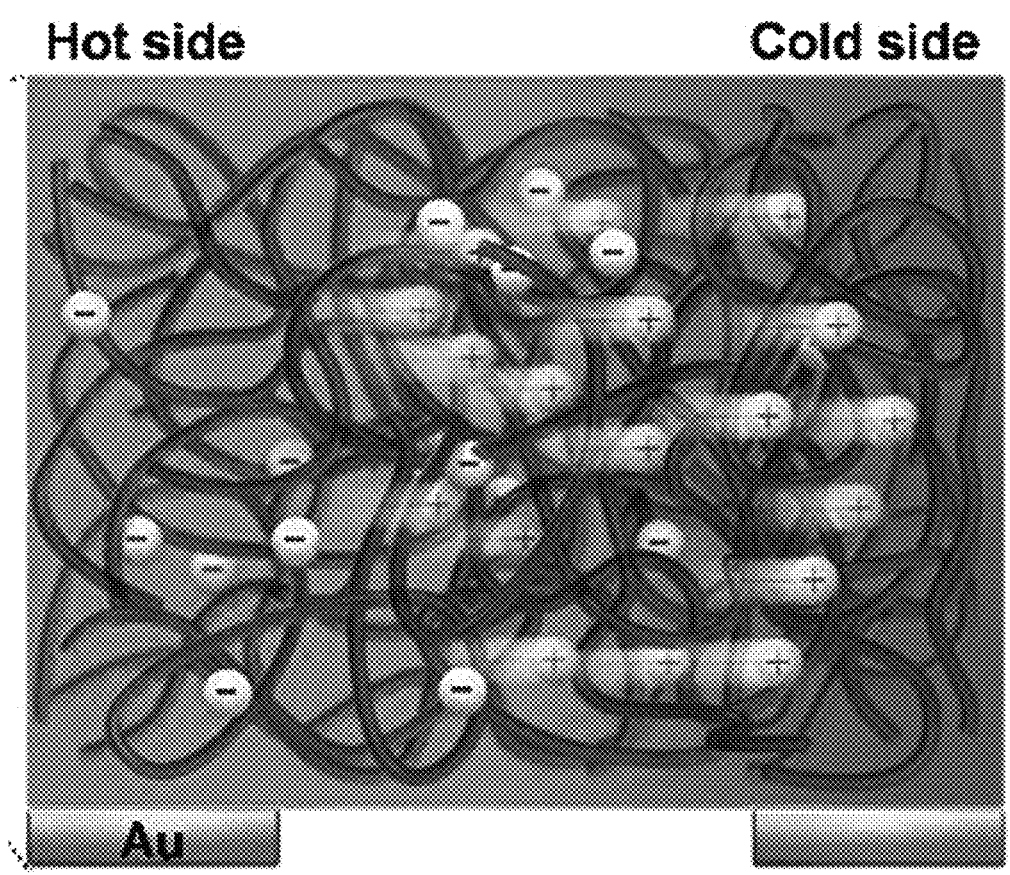
FIG. 15B is a schematic view illustrating the diffusion of $EMIM^+$ cations in the ion thermoelectric elastomer under a temperature gradient.

In addition, FIG. 15B is a schematic view illustrating the diffusion of EMIM$^+$ cations in the ion thermoelectric elastomer under a temperature gradient.

Referring to FIG. 15B, when the ITE is temperature gradient according to FIG. 15A, the mobile EMIM$^+$ cations dissociated from the EMIM$^+$TFSI$^-$ by the hydrogen bond can move from a hot side to a cold side due to the Soret effect and segmental motion of the PEGDA.

Figure 16A:
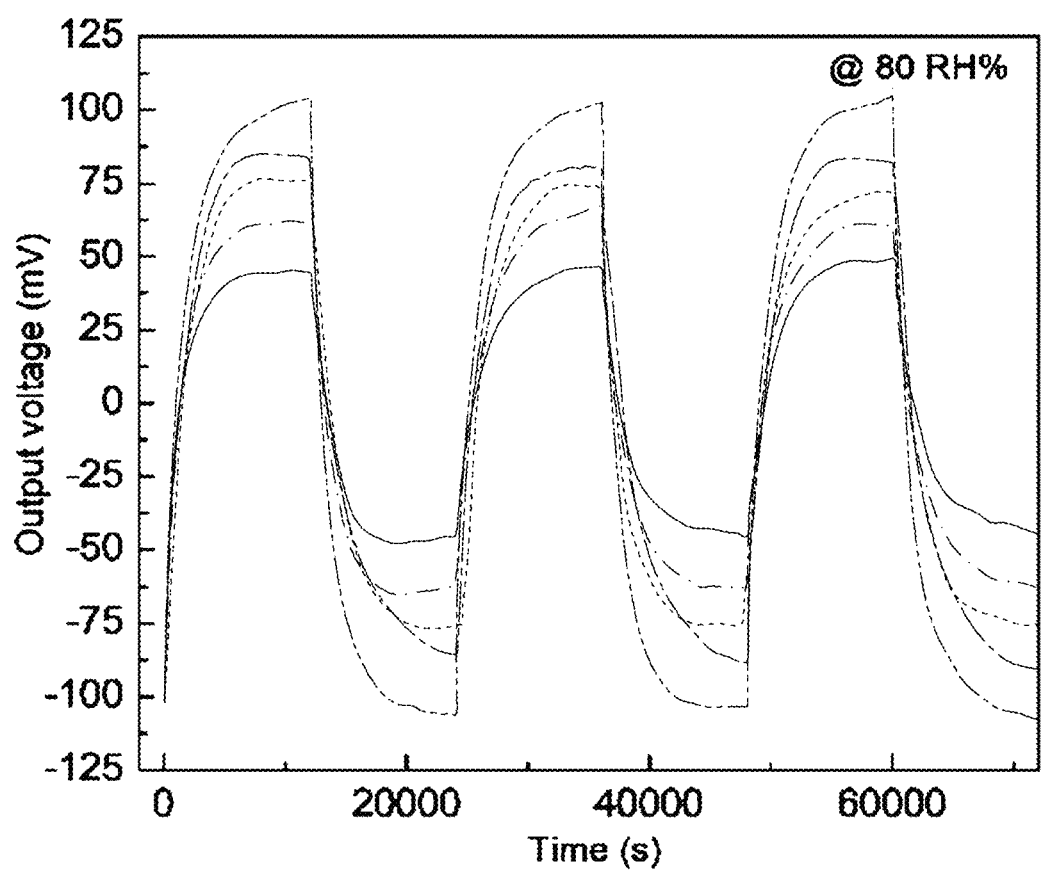
FIG. 16A is a graph illustrating the output voltage of the ion thermoelectric elastomer ($ITE_{0.4-30}$) prepared according to Preparation Example according to time for each temperature gradient (ΔT) (1.1° C., 1.6° C., ±2.1° C., 2.6° C., and ±3.5° C.).

FIG. 16A is a graph illustrating the output voltage of the ion thermoelectric elastomer (ITE$_{0.4\text{-}30}$) prepared according to Preparation Example according to time for each temperature gradient (ΔT) (1.1° C., ±1.6° C., ±2.1° C., ±2.6° C., and ±3.5° C.).

Referring to FIG. 16A, it was confirmed that the output voltage generated by various temperature gradients at 80% RH can be measured over a temperature gradient range (Δ|T|)) of 1.1° C. to 3.5° C. after a stabilization time.

Figure 16B:
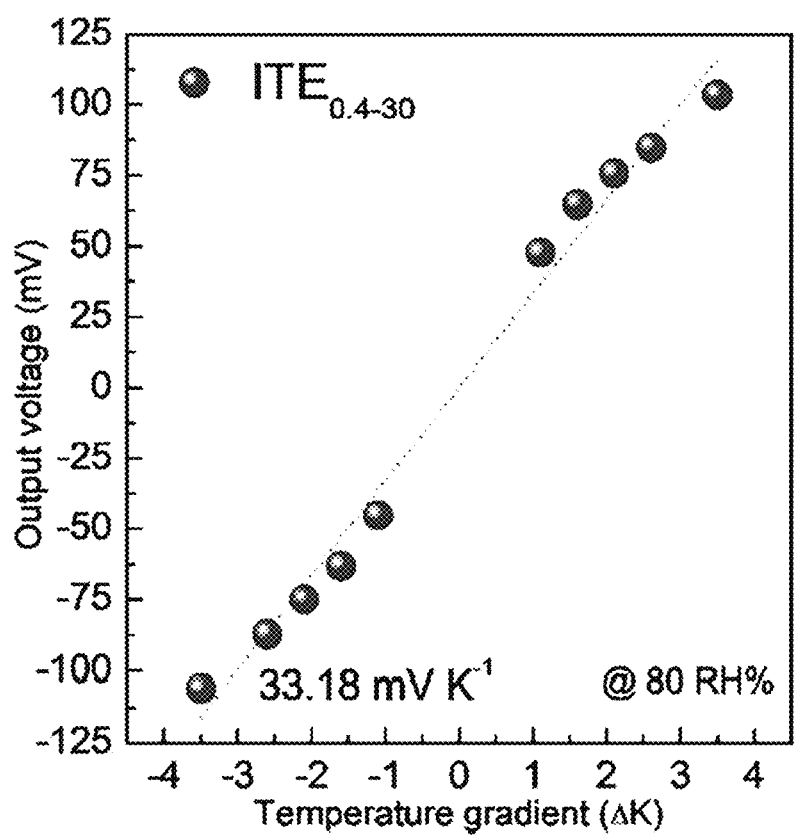
FIG. 16B is a graph illustrating an output voltage as a function of a temperature gradient (AK) for the ion thermoelectric elastomer ($ITE_{0.4-30}$) prepared according to Preparation Example.

FIG. 16B is a graph illustrating an output voltage as a function of a temperature gradient (ΔK) for the ion thermoelectric elastomer (ITE$_{0.4\text{-}30}$) prepared according to Preparation Example.

Referring to FIG. 16B, it was confirmed that the output voltage is proportional to the temperature gradient, i.e., the Seebeck coefficient is determined by the fitting slope of the graph of the output voltage with respect to the temperature gradient using the linear fitting of Origin 8, and specifically, the Seebeck coefficient for ITE$_{0.4\text{-}30}$ is 33.18 mVK$^{-1}$ at 80% RH.

Figure 17:
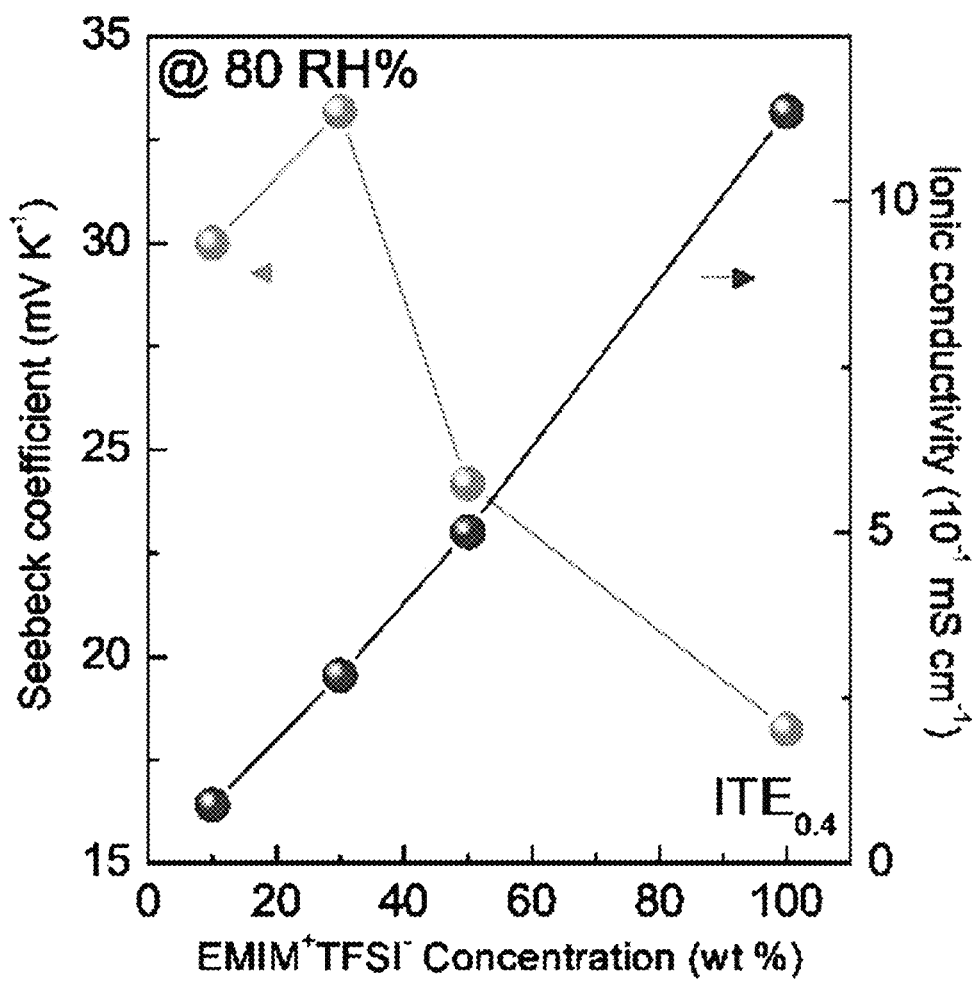
FIG. 17 is a graph illustrating a Seebeck coefficient and an ionic conductivity (80% RH) as a function of an $EMIM^+TFSI^-$ content in the ion thermoelectric elastomer ($ITE_{0.4}$) prepared according to Preparation Example.

FIG. 17 is a graph illustrating a Seebeck coefficient and an ionic conductivity (80% RH) as a function of an EMIM$^+$TFSI$^-$ content in the ion thermoelectric elastomer (ITE$_{0.4}$) prepared according to Preparation Example.

Referring to FIG. 17, it was confirmed that the ion thermoelectric elastomer (ITE$_{0.4}$) had a positive Seebeck coefficient for all content ranges of the EMIM$^+$TFSI$^-$, in particular, in the case of ITE$_{0.4\text{-}30}$, as the EMIM$^+$TFSI$^-$ increased, the Seebeck coefficient increased from 29.99 mVK$^{-1}$ to 33.18 mVK$^{-1}$ and was confirmed to be the highest in value, which was due to an increase in the number of dissociated mobile EMIM$^+$ cations.

On the other hand, as the content of the EMIM$^+$TFSI$^-$ increases, the Seebeck coefficient decreased to 24.18 mVK$^{-1}$ (ITE$_{0.4\text{-}50}$) and 18.23 mVK$^{-1}$ (ITE$_{0.4\text{-}100}$), and it was confirmed that this is due to the fact that as the EMIM$^+$TFSI$^-$ content increases, the electrostatic interaction between the respective dissociated EMIM$^+$ and TFSI$^-$ ions increased, and thus the Seebecck coefficient was lowered.

In addition, the ionic conductivity measurement of the ion thermoelectric elastomer was performed as follows. The ion thermoelectric elastomer in the structure according to FIG. 15A was measured by impedance spectroscopy, and then the ionic conductivity was determined. Specifically, Nyquist plots were derived by electrochemical impedance spectroscopy (EIS) in the range of 1 Hz to 10 MHz using a multichannel potentiostat (VMP2, Biologic) with a voltage amplitude of 100 mV, and then the ionic conductivity was determined using Equation 2 below. The humidity-dependent ionic conductivity measurement was also performed in an acrylic chamber, and the humidity inside the chamber was automatically controlled by an Arduino and a hygrometer.

$$\sigma = Rb^{-1} \cdot L \cdot A^{-1} \quad \text{[Equation 2]}$$

Where Rb$^{-1}$ is a bulk resistance obtained from an intercept of the semicircle with the real axis (Z') at low frequencies derived from Nyquist plots, L is a thickness, and A is an area of a film.

Referring to FIG. 17, it was confirmed that the calculated ionic conductivities of the ion thermoelectric elastomers (ITE$_{0.4}$) were 0.88×10$^{-1}$ mScm$^{-1}$ (ITE$_{0.4\text{-}10}$), 2.84×10$^{-1}$ mScm$^{-1}$ (ITE$_{0.4\text{-}30}$), 5.00×10$^{-1}$ mScm$^{-1}$ (ITE$_{0.4\text{-}50}$), and 11.36×10$^{-1}$ mScm$^{-1}$ (ITE$_{0.4\text{-}100}$), respectively, for the EMIM$^+$TFSI$^-$ content at 80% RH, and this confirming that the ionic conductivity of the ion thermoelectric elastomer increased as the concentration of the charge carriers increased when the EMIM$^+$TFSI$^-$ content increased.

Figure 18:
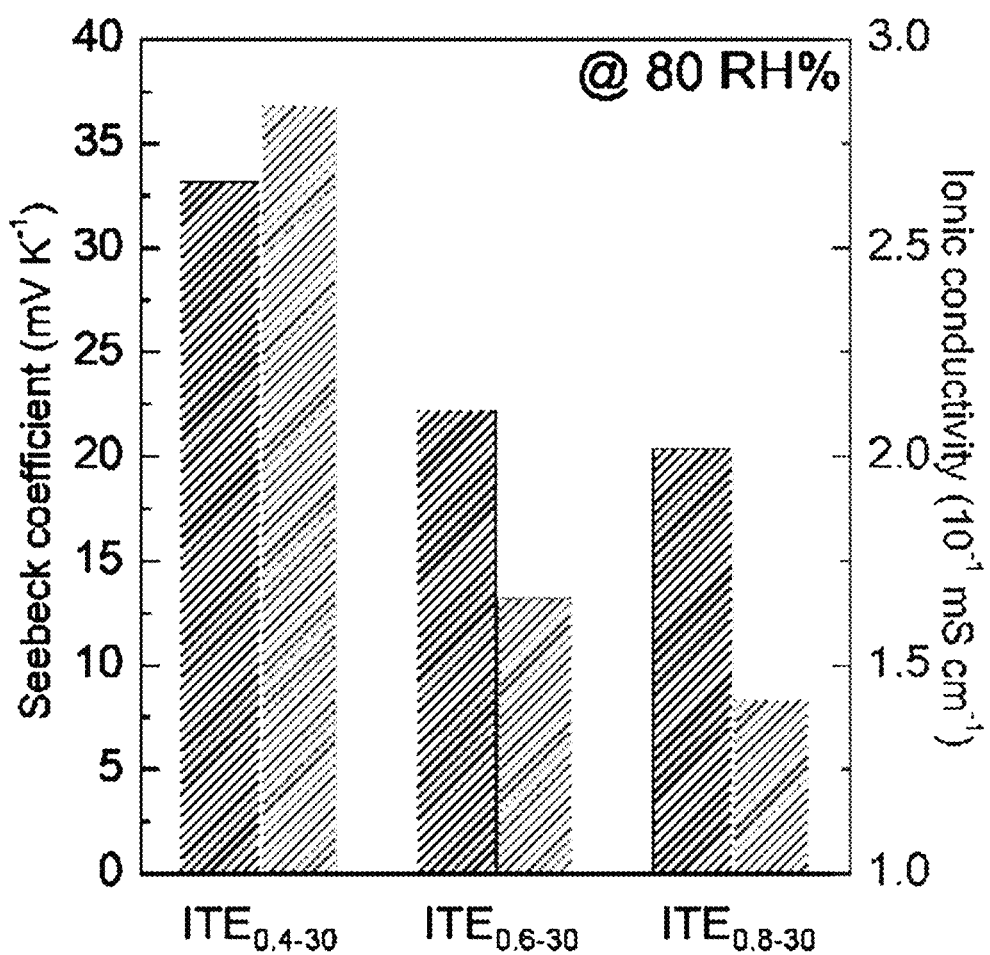
FIG. 18 is a graph illustrating a Seebeck coefficient and an ionic conductivity (80% RH) as a function of a PEGDA content in the ion thermoelectric elastomer (ITE) prepared according to Preparation Example.

FIG. 18 is a graph illustrating a Seebeck coefficient and an ionic conductivity (80% RH) as a function of a PEGDA content in the ion thermoelectric elastomer (ITE) prepared according to Preparation Example.

Referring to FIG. 18, it was confirmed that the Seebeck coefficients of ITE$_{0.8-30}$, ITE$_{0.6-30}$, and ITE$_{0.4-30}$ were 20.36 mVK$^{-1}$, 22.19 mVK$^{-1}$, and 33.18 mVK$^{-1}$, respectively. In addition, it was confirmed that the ionic conductivity of the corresponding ITE increased from 1.41×10$^{-1}$ mS cm$^{-1}$ to 2.84×10$^{-1}$ mS cm$^{-1}$ due to the presence of the PEGDA, which can transmit EMIM cations by a segmental motion. That is, it was confirmed that the Seebeck coefficient and the ionic conductivity of the ion thermoelectric elastomer according to the present disclosure were correlated with the ratio of the 2-HEA and the PEGDA, and specifically, it was confirmed that the number of mobile EMIM$^+$ cations dissociated by the PEGDA increased as the content of PEGDA increased, thereby increasing the Seebeck coefficient and the ionic conductivity.

Figure 19:
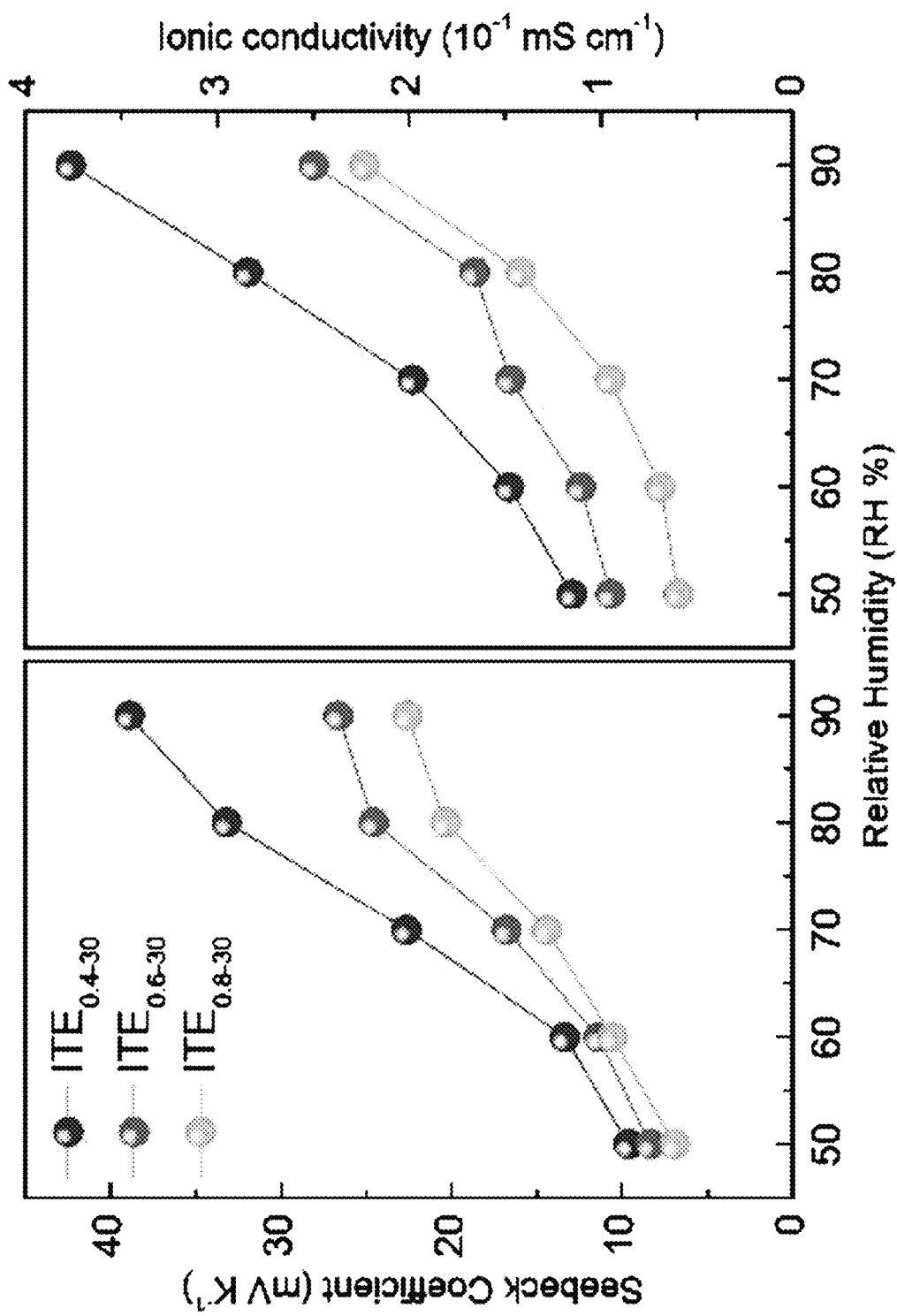
FIG. 19 is a graph illustrating a Seebeck coefficient and an ionic conductivity as a function of a change in humidity of the ion thermoelectric elastomer prepared according to Preparation Example.

FIG. 19 is a graph illustrating a Seebeck coefficient and an ionic conductivity as a function of a change in humidity of the ion thermoelectric elastomer prepared according to Preparation Example.

Referring to FIG. 19, it was confirmed that all ITEs had a higher Seebeck coefficient as the RH increased from 50% to 90%, and this confirmed that the water molecules absorbed by the hydroxyl group (—OH) of the 2-HEA generated a solvation shell that not only screened the dissociated EMIM$^+$ and TFSI$^-$ ions, but also inhibited the electrostatic interaction of the EMIM$^+$ and TFSI$^-$ ions, which are responsible for the low activation energy for transport. Further, it was confirmed that, for the ionic conductivity, ITE$_{0.8-30}$ was 0.597×10$^{-1}$ mS cm$^{-1}$ at 50% RH, while ITE$_{0.4-30}$, ITE$_{0.6-30}$, and ITE$_{0.8-30}$ were 3.764×10$^{-1}$ mScm$^{-1}$, 2.497×10$^{-1}$ mScm$^{-1}$, and 2.231×10$^{-1}$ mScm$^{-1}$, respectively, at 90% RH, and thus it was confirmed that the ionic conductivity also increased with the increase of RH because the absorbed water molecules formed solvation shells and penetration paths to promote effective ion transport. The Seebeck coefficient and ionic conductivity according thereto of the ion thermoelectric elastomer according to the present disclosure are shown in Table 2 below.

TABLE 2

| Sample | Resistance (Ω) | Length (mm) | Thickness (μm) | Width (mm) | Conductivity (10$^{-1}$ mS cm$^{-1}$) | Seebeck Coefficient (mV K$^{-1}$) | Humidity (% RH) |
|---|---|---|---|---|---|---|---|
| ITF$_{0.4-10}$ | 857489 | 5 | 313 | 4.525 | 0.38697 | | 50 |
| | 650201 | | 314 | | 0.54122 | | 60 |
| | 479480 | | 310 | | 0.74339 | | 70 |
| | 391437 | | 320 | | 0.88314 | | 80 |
| | 236710 | | 334 | | 1.39762 | | 90 |
| ITF$_{0.4-30}$ | 195256 | 5 | 371 | 6 | 1.15038 | 9.635 | 50 |
| | 149916 | | 376 | | 1.47837 | 13.37 | 60 |
| | 110584 | | 380 | | 1.98309 | 22.64 | 70 |
| | 77191 | | 380 | | 2.84098 | 33.18 | 80 |
| | 58105 | | 381 | | 3.76427 | 38.904 | 90 |
| ITF$_{0.4-50}$ | 238483 | 5 | 132 | 7 | 2.26903 | | 50 |
| | 181876 | | 125 | | 3.14186 | | 60 |
| | 149437 | | 133 | | 3.59387 | | 70 |
| | 107289 | | 133 | | 5.0057 | | 80 |
| | 82742 | | 135 | | 6.49074 | | 90 |
| ITF$_{0.4-100}$ | 30803 | 5 | 470 | 4 | 8.63414 | | 50 |
| | 30507 | | 470 | | 8.71792 | | 60 |
| | 27833 | | 476 | | 9.43502 | | 70 |
| | 33115 | | 475 | | 11.36081 | | 80 |
| | 20252 | | 478 | | 12.99417 | | 90 |
| ITF$_{0.6-30}$ | 330098 | 5 | 313 | 5.09 | 0.95075 | 8.341 | 50 |
| | 283524 | | 313 | | 1.10692 | 11.42 | 60 |
| | 216346 | | 309 | | 1.47419 | 16.78 | 70 |
| | 185738 | | 319 | | 1.65791 | 24.59 | 80 |
| | 120659 | | 326 | | 2.49732 | 26.64 | 90 |
| ITF$_{0.8-30}$ | 519220 | 5 | 239 | 6.75 | 0.59692 | 6.912 | 50 |
| | 455423 | | 236 | | 0.68919 | 10.582 | 60 |
| | 319217 | | 243 | | 0.9552 | 14.429 | 70 |
| | 215125 | | 244 | | 1.417 | 20.361 | 80 |
| | 136600 | | 246 | | 2.23156 | 22.597 | 90 |

That is, it was confirmed that in the ion thermoelectric elastomer according to the present disclosure, ionic thermoelectric properties, such as the ionic conductivity and the Seebeck coefficient, improved as humidity increases.

Figure 20:
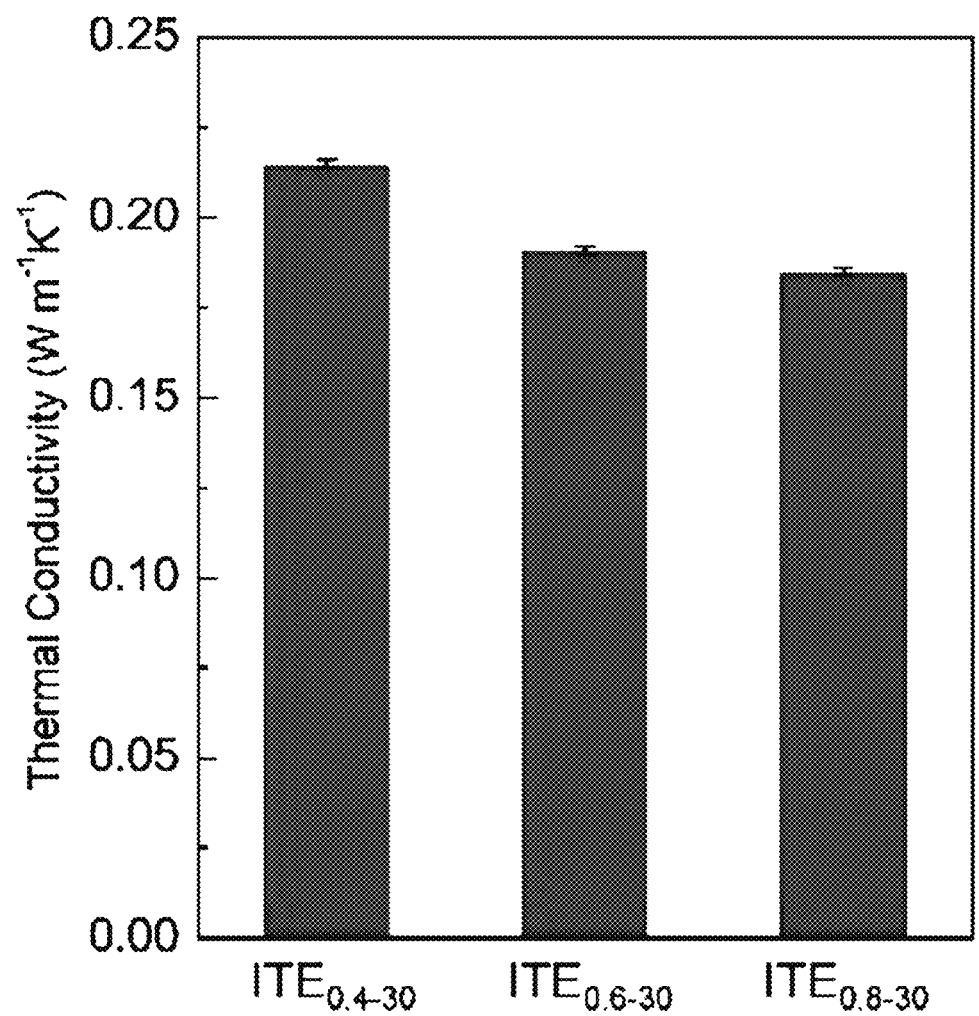
FIG. 20 is a graph illustrating a thermal conductivity as a function of a PEGDA content in the ion thermoelectric elastomer (ITE) prepared according to Preparation Example.
Figure 21:
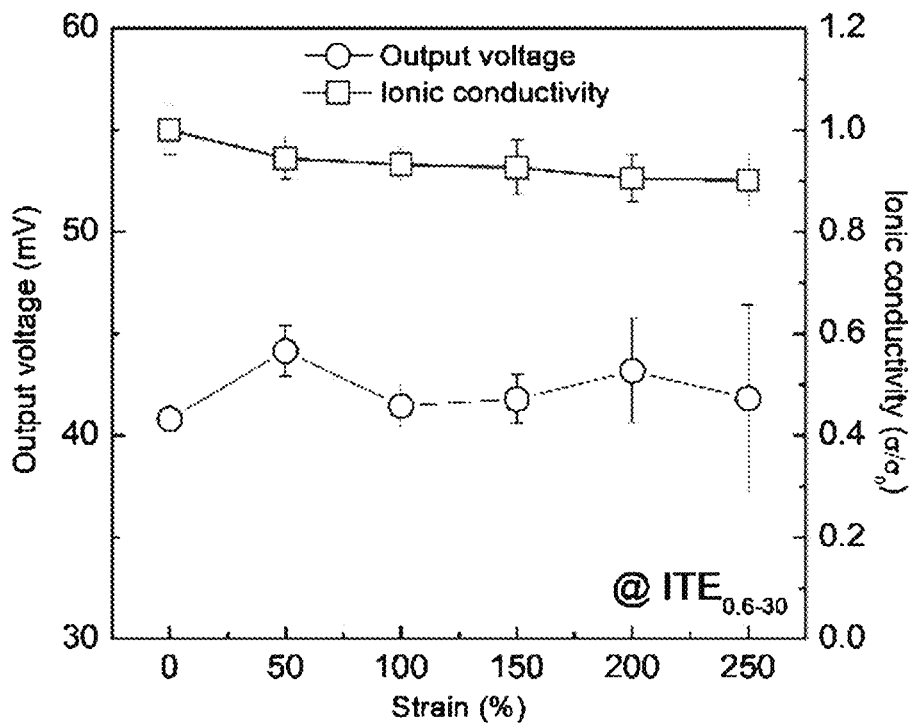
FIG. 21 is a graph illustrating an output voltage and an ionic conductivity as a function of an increasing tensile strain of the ion thermoelectric elastomer (ITE) prepared according to Preparation Example.
Figure 22:
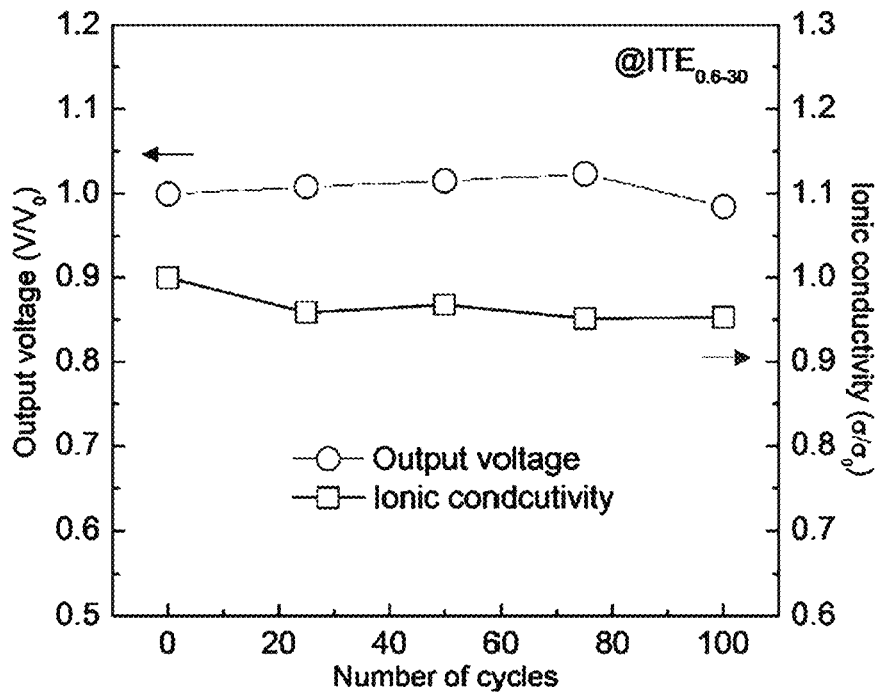
FIG. 22 is a graph illustrating an output voltage and an ionic conductivity as a function of 100 cycles of stretching/ releasing of the ion thermoelectric elastomer (ITE) prepared according to Preparation Example.

FIG. 20 is a graph illustrating a thermal conductivity as a function of a PEGDA content in the ion thermoelectric elastomer (ITE) prepared according to Preparation Example. In addition, FIG. 21 is a graph illustrating an output voltage and an ionic conductivity as a function of an increasing tensile strain of the ion thermoelectric elastomer (ITE) prepared according to Preparation Example. FIG. 22 is a graph illustrating an output voltage and an ionic conductivity as a function of 100 cycles of stretching/releasing of the ion thermoelectric elastomer (ITE) prepared according to Preparation Example.

Referring to FIG. 20, it was confirmed that the thermal conductivities of ITE$_{0.4-30}$, ITE$_{0.6-30}$, and ITE$_{0.8-30}$ were 0.215 Wm$^{-1}$K$^{-1}$, 0.191 Wm$^{-1}$K$^{-1}$, and 0.185 Wm$^{-1}$K$^{-1}$, respectively, and were nearly constant. In addition, referring to FIG. 21, it was confirmed that the output voltage of ITE$_{0.6-30}$ was nearly constant at 42 mV even at a strain of up to 250%, and this confirmed that approximately 90% of ionic conductivity was maintained even at a tensile strain of 250%, and referring to FIG. 22, it was confirmed that the output voltage and the ionic conductivity of the ITE$_{0.6-30}$ were constant even after 200% stretching/releasing for 100 cycles.

FIG. 23 is a graph illustrating a Seebeck coefficient as a function of a change in a tensile strain for the ion thermoelectric elastomer (ITE$_{0.6-30}$) prepared according to Preparation Example of the present disclosure as compared to conventional organic/inorganic hybrid materials.

Referring to FIG. 23, it was confirmed that the ion thermoelectric elastomer (ITE$_{0.6-3}$) prepared according to Preparation Example exhibited the highest Seebeck coefficient even at a high tensile strain as compared to the conventional organic/inorganic hybrid materials.

That is, the ion thermoelectric elastomer according to the present disclosure exhibits further improved ionic thermoelectric properties as compared to conventional materials by including an appropriate content of each component.

Experimental Example 5: Utilization of Thermoelectric Element Using Ion Thermoelectric Elastomer FIG. 24 is a graph illustrating an output voltage of the ion thermoelectric elastomer (ITE$_{0.6-30}$) prepared according to Preparation Example at an in-plane temperature range T (Tc, Th ° C.). Here, the output voltage at a given temperature gradient is defined as T(Tc, Th ° C.) at 80% RH, where Tc is the temperature at the low temperature side and Th is the temperature at the high temperature side.

Referring to FIG. 24, it was confirmed that the maximum output voltage of 331.18 mV of ITE$_{0.6-30}$ could be obtained at the highest temperature gradient T(26.9, 69.3° C.), and this confirms that ITE$_{0.6-30}$ can harvest energy at an in-plane high temperature gradient ranging from 15° C. to 50° C.

FIG. 25 is a schematic view of an ionic thermoelectric elastomer device (ITED) prepared using the ion thermoelectric elastomer prepared according to Preparation Example.

Referring to FIG. 25, on a biocompatible Tegardem film, the ITED was prepared by using the ion thermoelectric elastomer (ITE$_{0.6-30}$) prepared according to Preparation Example as a thermoelectric material, using Au/Cu foil electrodes as a first electrode and a second electrode, which are electrically connected to both sides of the ion thermoelectric elastomer (ITE$_{0.6-30}$) that is the thermoelectric material, respectively, and placing the Au/Cu foil electrodes on one side surfaces to face each other. At this time, the Au electrodes were thermally deposited on the Cu foil and then cut into a desired rectangular pattern. Thereafter, the Au electrodes were placed on a front layer of the Tegaderm (3M) film, and then the ion thermoelectric elastomer (ITE$_{0.6-30}$) prepared according to Preparation Example was sandwiched between the lower Au electrode and the upper Au electrode to finally manufacture the ITED.

FIG. 26A is an image of the ITED positioned on a surface of a light bulb and powered up for a temperature gradient, and FIG. 26B is a graph illustrating an output voltage of the ITED after the temperature gradient of FIG. 26A.

Referring to FIGS. 26A and 26B, it was confirmed that when the ITED was placed on the light bulb and a switch was repeatedly turned on and off, the heat of the light bulb was transferred to the ITED to generate a certain temperature gradient between the lower electrode (59.3° C.) and the upper electrode (66.2° C.), and the output voltage due to the temperature gradient increased to 83 mV after a saturation time and repeatedly decreased to 0 mV after the temperature gradient was removed. That is, it was confirmed that the ITED manufactured using the ion thermoelectric elastomer according to the present disclosure can generate an output voltage and operate stably even on a high-temperature curved surface due to its excellent mechanical performance and thermal stability.

FIG. 27A is an image generated by placing the ITED on the back of a computer monitor and generating a temperature gradient, and FIG. 27B is a graph illustrating an output voltage of the ITED after the temperature gradient of FIG. 27A.

Referring to FIGS. 27A and 27B, it was confirmed that the heat from the monitor generated a temperature gradient of 26.9° C. and 28.1° C., and that the output voltage of the ITED at this temperature gradient was about 14 mV at 50% RH.

FIG. 28A is an image of the ITEDs continuously placed on a surface of a human skin, and FIG. 28B is a graph illustrating an output voltage of the ITED after the temperature gradient according to FIG. 28A.

Referring to FIGS. 28A and 28B, average temperatures of the continuously positioned ITEDs were 30.1° C. and 28.6° C. at the lower and upper electrodes, respectively, and an output voltage of about 16 mV was obtained by appropriately attaching three ITEDs to a human arm.

Accordingly, the ITED including the ion thermoelectric elastomer according to the present disclosure has excellent compatibility with the curvature of the skin due to excellent mechanical performance, is excellent in various environments, and exhibits stable thermoelectric performance.

The invention claimed is:

1. An ion thermoelectric elastomer comprising:
   a polymer matrix in which poly(ethylene glycol) diacrylate (PEGDA) and 2-hydroxyethyl acrylate (2-HEA) are cross-linked; and
   an ion conductive dopant dispersed in the polymer matrix,
   wherein the ion conductive dopant is hydrogen-bonded to the polymer matrix, and
   wherein as a content of the ion conductive dopant increases, a Young's modulus of the ion thermoelectric elastomer decreases,
   wherein a content of the 2-HEA is 55 wt % to 65 wt % based on a total of 100 wt % of the polymer matrix,
   wherein the ion conductive dopant is included in an amount of 25 parts by weight to 35 parts by weight based on a total of 100 parts by weight of the polymer matrix,
   wherein the ion conductive dopant is 1-Ethyl-3-methylimidazolium bis(trifluoromethylsulfonyl)imide ([EMIM] [TFSI]), and
   wherein a Seebeck coefficient of the ion thermoelectric elastomer at a tensile strain of 250% is not lower than 20 mV K-1.

2. The ion thermoelectric elastomer of claim 1, wherein the PEGDA has a weight average molecular weight (Mw) of 5000 g/mol to 7000 g/mol.

3. A thermoelectric element comprising:
   a thermoelectric material including the ion thermoelectric elastomer of claim 1; and
   a first electrode and a second electrode that are electrically connected to one side and the other side of the thermoelectric material, respectively, and disposed on one side surfaces to face each other.

4. The ion thermoelectric elastomer of claim 1, wherein the content of the 2-HEA is 60 wt % based on a total of 100 wt % of the polymer matrix, and
   the ion conductive dopant is included in an amount of 30 parts by weight based on a total of 100 parts by weight of the polymer matrix.

* * * * *